(12) United States Patent
Choi et al.

(10) Patent No.: US 12,408,274 B2
(45) Date of Patent: Sep. 2, 2025

(54) PRINTED CIRCUIT BOARD AND ELECTRONIC DEVICE INCLUDING THE SAME

(71) Applicant: Samsung Electronics Co., Ltd., Suwon-si (KR)

(72) Inventors: Taihwan Choi, Suwon-si (KR); Jongdoo Kim, Suwon-si (KR); Jongmin Kim, Suwon-si (KR); Ungki Min, Suwon-si (KR); Gunhee Park, Suwon-si (KR); Daeseung Park, Suwon-si (KR); Garam Yu, Suwon-si (KR); Bongyeol Lee, Suwon-si (KR); Hanyeop Lee, Suwon-si (KR); Gun Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 215 days.

(21) Appl. No.: 18/446,820

(22) Filed: Aug. 9, 2023

(65) Prior Publication Data

US 2024/0032200 A1    Jan. 25, 2024

Related U.S. Application Data

(63) Continuation of application No. PCT/KR2023/010117, filed on Jul. 14, 2023.

(30) Foreign Application Priority Data

Jul. 20, 2022   (KR) .................. 10-2022-0089401
Aug. 25, 2022  (KR) .................. 10-2022-0107038

(51) Int. Cl.
H05K 1/18    (2006.01)

(52) U.S. Cl.
CPC .............. *H05K 1/183* (2013.01); *H05K 2201/10037* (2013.01); *H05K 2201/10083* (2013.01)

(58) Field of Classification Search
CPC ........ H05K 1/0227; H05K 1/18; H05K 1/183; H05K 2201/09063; H05K 2201/093; H05K 2201/10083
See application file for complete search history.

(56) References Cited

U.S. PATENT DOCUMENTS 9,332,329 B2    5/2016  Cheng et al.
10,747,274 B2   8/2020  Uttermann et al.
(Continued)

FOREIGN PATENT DOCUMENTS

CN    103179236 A    6/2013
CN    108650345 A    10/2018
(Continued)

OTHER PUBLICATIONS

International Search Report dated Oct. 18, 2023, issued in International Patent Application No. PCT /KR2023/010117.

*Primary Examiner* — Nathan Milakovich
(74) *Attorney, Agent, or Firm* — Jefferson IP Law, LLP

(57) ABSTRACT

An electronic device is provided. The electronic device includes an electronic component including a coil therein, and a printed circuit board that is disposed to surround at least a part of the electronic component and includes plural slits disposed at preset intervals in at least one of regions facing the electronic component, wherein each of the plural slits may include a central slit portion extended along a center of the slit, and a symmetric slit portion extended to be symmetric with respect to the central slit portion.

20 Claims, 16 Drawing Sheets

(56) References Cited

U.S. PATENT DOCUMENTS

| | | |
|---|---|---|
| 2012/0176282 A1 | 7/2012 | Kato et al. |
| 2012/0308013 A1 | 12/2012 | Kim |
| 2013/0156233 A1 | 6/2013 | Joo |
| 2013/0307746 A1* | 11/2013 | Nakano .............. G06K 7/10178 |
| | | 343/866 |
| 2018/0131093 A1* | 5/2018 | Tenno ....................... H01Q 7/08 |
| 2018/0144861 A1* | 5/2018 | Song ..................... H01F 27/366 |
| 2019/0027808 A1 | 1/2019 | Mow et al. |
| 2020/0412875 A1 | 12/2020 | Brooks |
| 2021/0203189 A1 | 7/2021 | Peralta et al. |
| 2021/0298165 A1 | 9/2021 | Jeon |
| 2022/0061151 A1 | 2/2022 | Oh et al. |

FOREIGN PATENT DOCUMENTS

| | | |
|---|---|---|
| CN | 112398990 A | 2/2021 |
| JP | 5674363 B2 | 2/2015 |
| JP | 6394807 B2 | 9/2018 |
| KR | 10-2012-0049930 A | 5/2012 |
| KR | 10-2012-0133894 A | 12/2012 |
| KR | 10-1593926 B1 | 2/2016 |
| KR | 10-2017-0032149 A | 3/2017 |
| KR | 10-2021-0001813 A | 1/2021 |

* cited by examiner

PRINTED CIRCUIT BOARD AND ELECTRONIC DEVICE INCLUDING THE SAME

CROSS-REFERENCE TO RELATED APPLICATION(S)

This application is a continuation application, claiming priority under § 365(c), of an International application No. PCT/KR2023/010117, filed on Jul. 14, 2023, which is based on and claims the benefit of a Korean patent application number filed on Jul. 20, 2022, in the Korean Intellectual Property Office, and of a Korean patent application number 10-2022-0107038, filed on Aug. 25, 2022, in the Korean Intellectual Property Office, the disclosure of each of which is incorporated by reference herein in its entirety.

TECHNICAL FIELD

The disclosure relates to a printed circuit board and an electronic device including the same.

BACKGROUND ART

A portable electronic device including a speaker (e.g., smartphone) may be designed in a structure where a portion of a printed circuit board included in the portable electronic device is cut off and a speaker is placed thereat in order to make the thickness thin. For example, the cut portion of the printed circuit board may be disposed to surround at least a portion of the circumference of the speaker.

The portable electronic device may include a battery for supplying power to a power consuming component (e.g., power amplifier) disposed on the printed circuit board. As power is supplied from the battery to the power consuming component, a current path from the battery to the power consuming component and a return current path from the power consuming component to the ground portion of the printed circuit board may be formed.

The above information is presented as background information only to assist with an understanding of the disclosure. No determination has been made, and no assertion is made, as to whether any of the above might be applicable as prior art with regard to the disclosure.

DISCLOSURE

Technical Problem

A part of the return current path spreading to the ground portion of the printed circuit board may be formed at the cut portion of the printed circuit board for arranging the speaker. A return current may flow through the portion of the printed circuit board being cut off (e.g., a portion of the printed circuit board surrounding the speaker), and thus an H-field may be formed due to the return current. The H-field passes through a coil inside the speaker and generates a current in the coil, which may cause unintended speaker operation.

The H-field applied to the speaker may be proportional to the intensity of current and inversely proportional to the square of the distance (e.g., distance between the speaker and the return current path). Since the gap between the printed circuit board and the speaker is minimized by design so as to make the portable electronic device thin and light, it may be difficult to use a method of increasing the distance between the speaker and the return current path to attenuate the H-field. Therefore, there is a need for a structure capable of reducing the intensity of a return current generated on the printed circuit board in order to attenuate the H-field.

Aspects of the disclosure are to address at least the above-mentioned problems and/or disadvantages and to provide at least the advantages described below. Accordingly, an aspect of the disclosure is to provide an electronic device for a structure capable of attenuating an H-field caused by a return current by blocking current flows around the speaker.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes an electronic component including a coil therein, and a printed circuit board that is disposed to surround at least a part of the electronic component and includes plural slits disposed at preset intervals in at least one of regions facing the electronic component, wherein each of the plural slits may include a central slit portion extended along a center of the slit, and a symmetric slit portion extended to be symmetric with respect to the central slit portion.

In accordance with another aspect of the disclosure, a printed circuit board is provided. The printed circuit includes a cut region formed by cutting off a portion of the printed circuit board, and a plurality of slits formed around the cut region, wherein each of the plural slits may include a central slit portion extended along a center of the slit and a symmetric slit portion extended to be symmetric with respect to the central slit portion.

Advantageous Effects

An electronic device according to an embodiment of the disclosure may include a printed circuit board having slits formed thereon to thereby attenuate H-fields formed in electronic components (e.g., speaker, receiver).

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
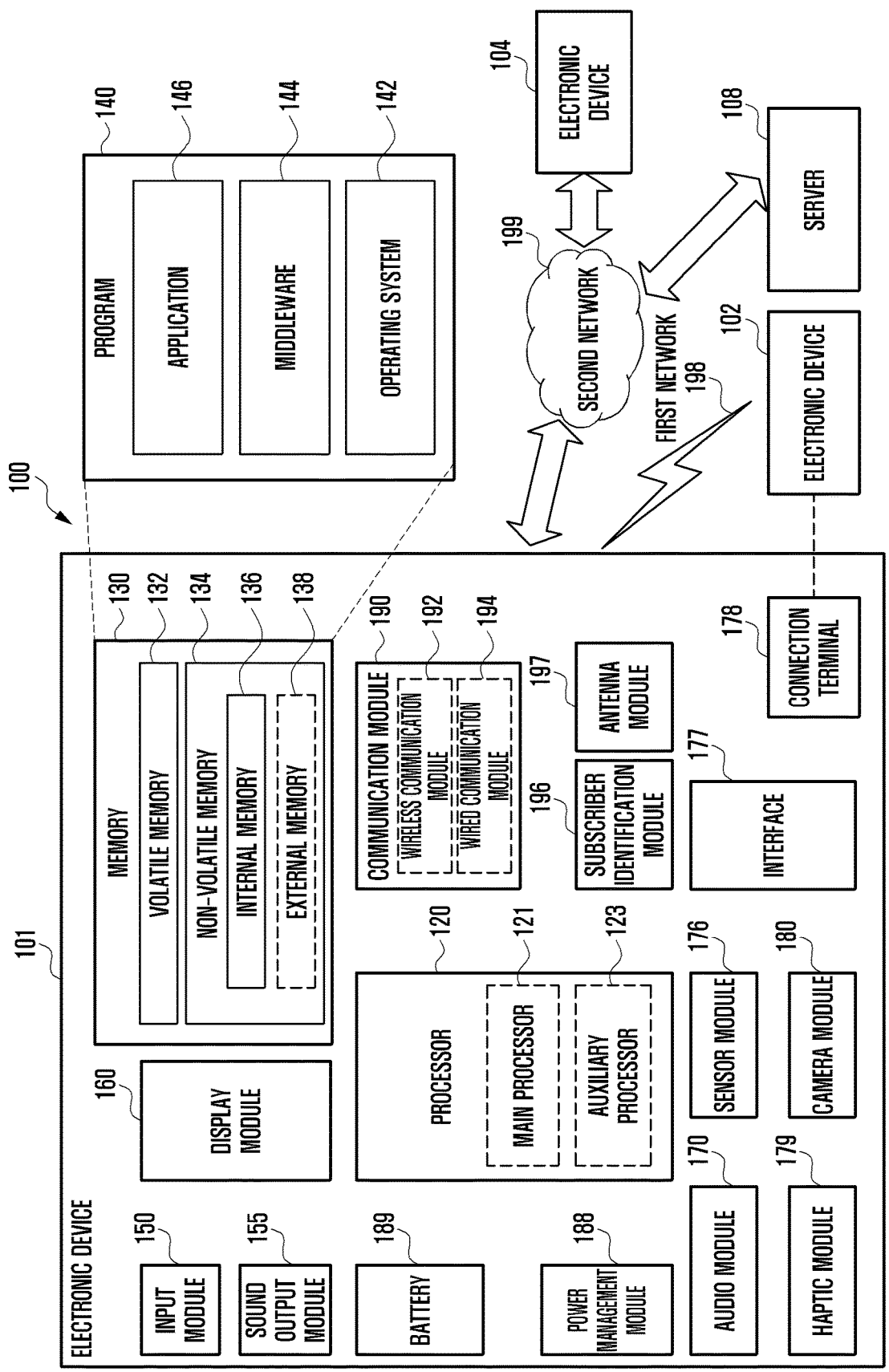
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beam-forming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to an embodiment of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
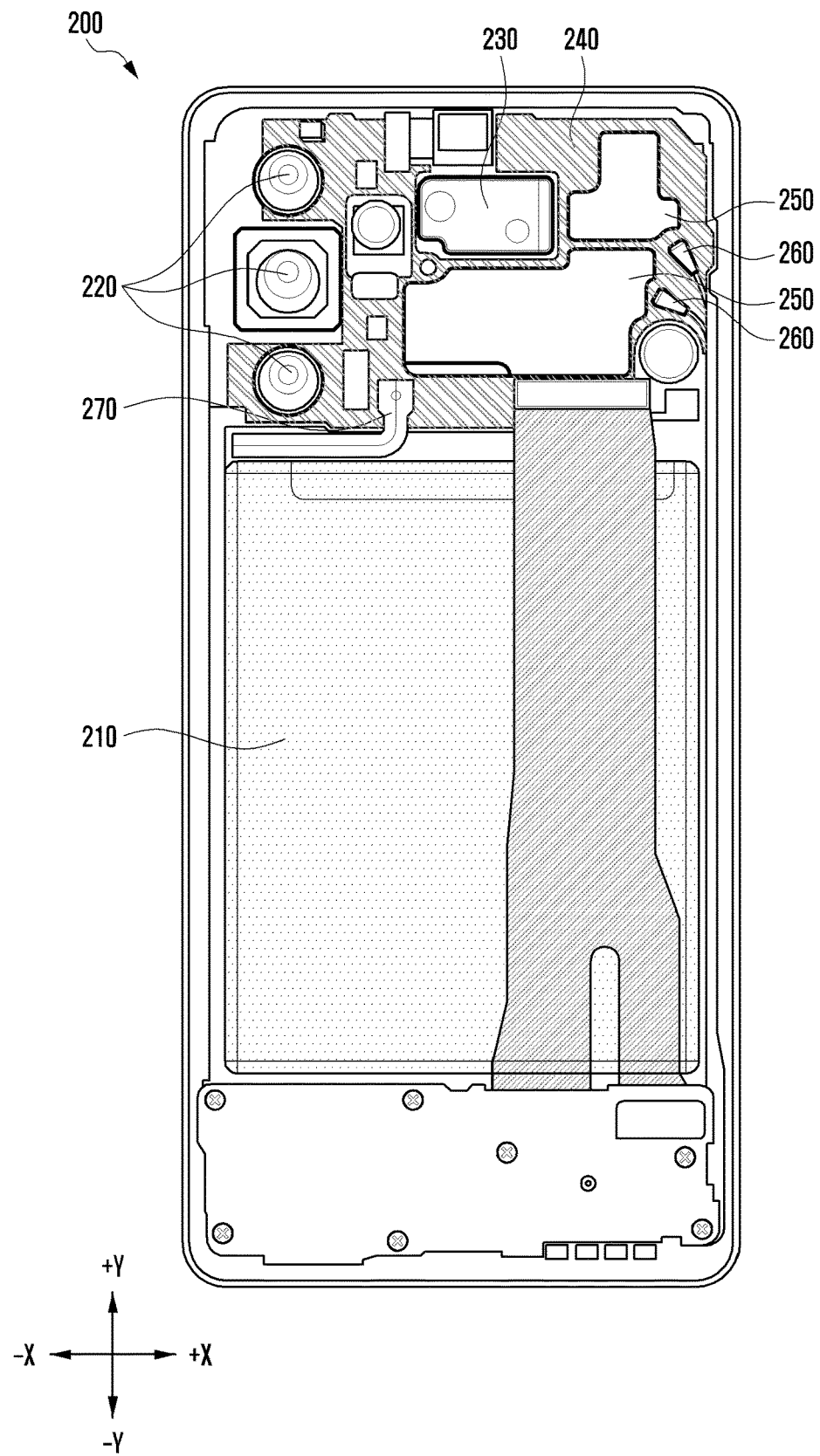
FIG. 2 is a view illustrating an electronic device according to an embodiment of the disclosure.

FIG. 2 is a view illustrating an electronic device 200 according to an embodiment of the disclosure.

In an embodiment of the disclosure, the electronic device 200 of FIG. 2 may refer to the electronic device 101 of FIG. 1 or may be an electronic device including at least some of the electronic device 101 of FIG. 1.

In describing the electronic device 200 according to an embodiment of the disclosure, the width direction of the electronic device 200 may mean the x-axis direction, and the length direction of the electronic device 200 may mean the y-axis direction.

In an embodiment of the disclosure, the electronic device 200 may include a battery 210, a camera module 220, an electronic component 230, a printed circuit board 240, a shield can 250, an antenna connection part 260, and/or a battery connector 270.

In an embodiment of the disclosure, the battery 210 in FIG. 2 may indicate the battery 189 in FIG. 1. The battery 210 may supply power to at least one component of the electronic device 200. For example, the battery 210 may supply power to a power consuming component disposed on the printed circuit board 240.

In an embodiment of the disclosure, the camera module 220 may capture still images and moving images. The camera module 220 in FIG. 2 may mean the camera module 180 in FIG. 1 or may include at least some of the camera module 180 in FIG. 1. For example, the camera module 220 may include one or more lenses, image sensors, image signal processors, and/or flashes.

In an embodiment of the disclosure, the electronic component 230 may be a component including a coil therein. For example, the electronic component 230 may be an acoustic instrument including a coil (e.g., speaker, receiver).

In an embodiment of the disclosure, the shield can 250 may be formed in a structure surrounding the exterior of a component disposed on the printed circuit board 240. For example, to shield noise generated from a power consuming component disposed on the printed circuit board 240, the shield can 250 may be disposed to surround the exterior of the power consuming component. Multiple power consuming components may be disposed inside the shield can 250, and the shield can 250 may serve to shield noise generated from the multiple power consuming components. The power consuming component may be a component that consumes relatively more power than other components of the electronic device 200. For example, the power consuming component may be a power amplifier (PA).

In an embodiment of the disclosure, the printed circuit board 240 may be disposed to surround at least a portion of the electronic component 230. For example, the printed circuit board 240 may surround the outer periphery of the electronic component 230 by being spaced apart from the outer circumference of the electronic component 230 in the x-axis direction and/or the y-axis direction.

In an embodiment of the disclosure, one direction of the printed circuit board 240 may indicate a negative x-axis direction with respect to the printed circuit board 240, and the other direction of the printed circuit board 240 may indicate a positive x-axis direction with respect to the printed circuit board 240.

In an embodiment of the disclosure, the camera module 220 may be positioned in one direction of the printed circuit board 240. For example, the camera module 220 may be positioned in a negative x-axis direction with respect to the printed circuit board 240.

In an embodiment of the disclosure, the antenna connection part 260 may be extended toward a power consuming component positioned inside the shield can 250 in the other direction (e.g., positive x-axis direction) of the printed circuit board 240, and may be disposed on one surface of the printed circuit board 240. The antenna connection part 260 may serve to electrically connect an antenna (e.g., antenna module 197 in FIG. 1) and the printed circuit board 240.

With reference to FIG. 2, the battery 210 may be disposed to be spaced apart in a longitudinal direction of the electronic device 200 with respect to the camera module 220, the electronic component 230, and/or the printed circuit board 240. For example, the battery 210 may be disposed in a negative y-axis direction with respect to the camera module 220, the electronic component 230, and/or the printed circuit board 240.

In various embodiments, the battery connector 270 may be disposed in one direction of the battery 210. For example, in FIG. 2, the battery connector 270 may be positioned in a positive y-axis direction with respect to the battery 210.

In an embodiment of the disclosure, the battery connector 270 may be connected to the battery 210 at one end thereof and connected to the printed circuit board 240 at the other end thereof. The battery connector 270 may serve to supply power generated from the battery 210 to the printed circuit board 240 by electrically connecting the battery 210 and the printed circuit board 240.

Although the battery 210 is shown as being positioned in a negative y-axis direction with respect to the printed circuit board 240 in FIG. 2, the relative positional relationship between the printed circuit board 240 and the battery 210 is not limited thereto. For example, the battery 210 may be positioned in a positive y-axis direction with respect to the printed circuit board 240.

FIGS. 3A, 3B, 3C and 3D are views illustrating an electronic component 230 and a printed circuit board 240 according to various embodiments of the disclosure.

In describing the printed circuit board 240 according to an embodiment of the disclosure, the width direction of the printed circuit board 240 may refer to the x-axis direction, and the length direction of the printed circuit board 240 may refer to the y-axis direction.

Figure 3A:
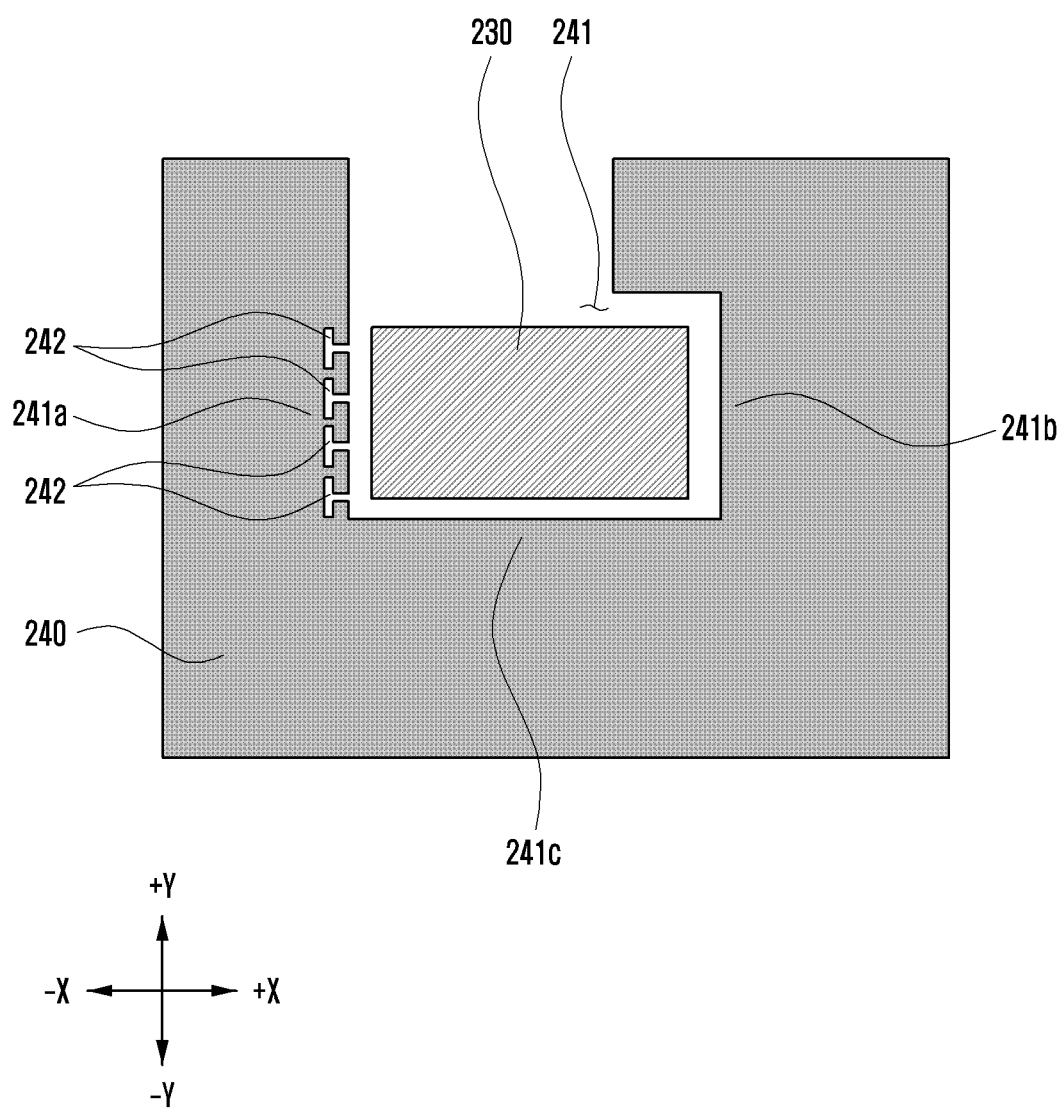
FIGS. 3A, 3B, 3C and 3D are views illustrating an electronic component and a printed circuit board according to various embodiments of the disclosure.

In an embodiment of the disclosure, the printed circuit board 240 may include a cut region 241 at least in part. The cut region 241 may be a region formed by cutting off a portion of the printed circuit board 240. For example, in FIG. 3A, a portion of the printed circuit board 240 may be cut off in the longitudinal and width directions of the printed circuit board 240 to form a cut region 241. Referring to FIG. 3A, the cut region 241 is illustrated as being formed in a rectangular shape, but this is illustrative and the shape of the cut region 241 may be not limited thereto.

In an embodiment of the disclosure, the electronic component 230 may be disposed in the cut region 241 of the printed circuit board 240. The electronic component 230 may be disposed in the cut region 241 and surrounded by the printed circuit board 240. In the cut region 241, the electronic component 230 may be positioned to be spaced apart from the printed circuit board 240.

In an embodiment of the disclosure, a first direction of the electronic component 230 may indicate a negative x-axis direction with respect to the electronic component 230. A second direction of the electronic component 230 may indicate a positive x-axis direction with respect to the electronic component 230. A third direction of the electronic component 230 may indicate a negative y-axis direction with respect to the electronic component 230. A fourth direction of the electronic component 230 may indicate a positive y-axis direction with respect to the electronic component 230.

In an embodiment of the disclosure, a first direction of the cut region 241 may refer to a negative x-axis direction with respect to the cut region 241, and a second direction of the cut region 241 may refer to a positive x-axis direction with respect to the cut region 241. A third direction of the cut region 241 may indicate a negative y-axis direction with respect to the cut region 241. A fourth direction of the cut region 241 may indicate a positive y-axis direction with respect to the cut region 241.

In an embodiment of the disclosure, the printed circuit board 240 may include a first region 241a, a second region 241b, and/or a third region 241c, which are regions surrounding the outer periphery of the electronic component 230.

In an embodiment of the disclosure, the first region 241a may refer to a region of the printed circuit board 240 that is spaced apart in the first direction of the electronic component 230 to face the electronic component 230. The second region 241b may refer to a region of the printed circuit board 240 that is spaced apart in the second direction of the electronic component 230 to face the electronic component 230. The third region 241c may refer to a region of the printed circuit board 240 that is spaced apart in the third direction of the electronic component 230 to face the electronic component 230.

In an embodiment of the disclosure, the printed circuit board 240 may include slits 242 at least in part. For example, plural slits 242 may be arranged at intervals in at least one of the first region 241a, the second region 241b, or the third region 241c of the printed circuit board 240.

In an embodiment of the disclosure, the printed circuit board 240 may include a ground at least in part. Alternatively, a ground, as a separate element from the printed circuit board 240, may be positioned around the outer periphery of the printed circuit board 240. The ground may contain a metallic material (e.g., copper) therein.

In an embodiment of the disclosure, the slit 242 may be a T-shaped groove formed by cutting off at least a portion of the ground. A non-conductive material may be disposed inside the slit 242 (e.g., space of slit groove).

FIGS. 3A, 3B, 3C and 3D depict that a portion of the printed circuit board 240 is directly cut off to form a slit 242, but this may be illustrative for explaining the position of the slit 242. For example, the slit 242 may be formed, not by directly cutting off a portion of the printed circuit board 240, but by cutting off a portion of the ground located around the outer periphery of the printed circuit board 240.

Referring to FIG. 3A, in an embodiment of the disclosure, a plurality of slits 242 may be formed in the first region 241a of the printed circuit board 240. For example, plural slits 242 may be disposed at specified intervals in the first region 241a along the length direction (e.g., y-axis direction) of the printed circuit board 240. Although the printed circuit board 240 is shown as including four slits 242 in FIG. 3A, this is illustrative and the number of slits 242 included in the printed circuit board 240 may be not limited thereto.

Figure 3B:
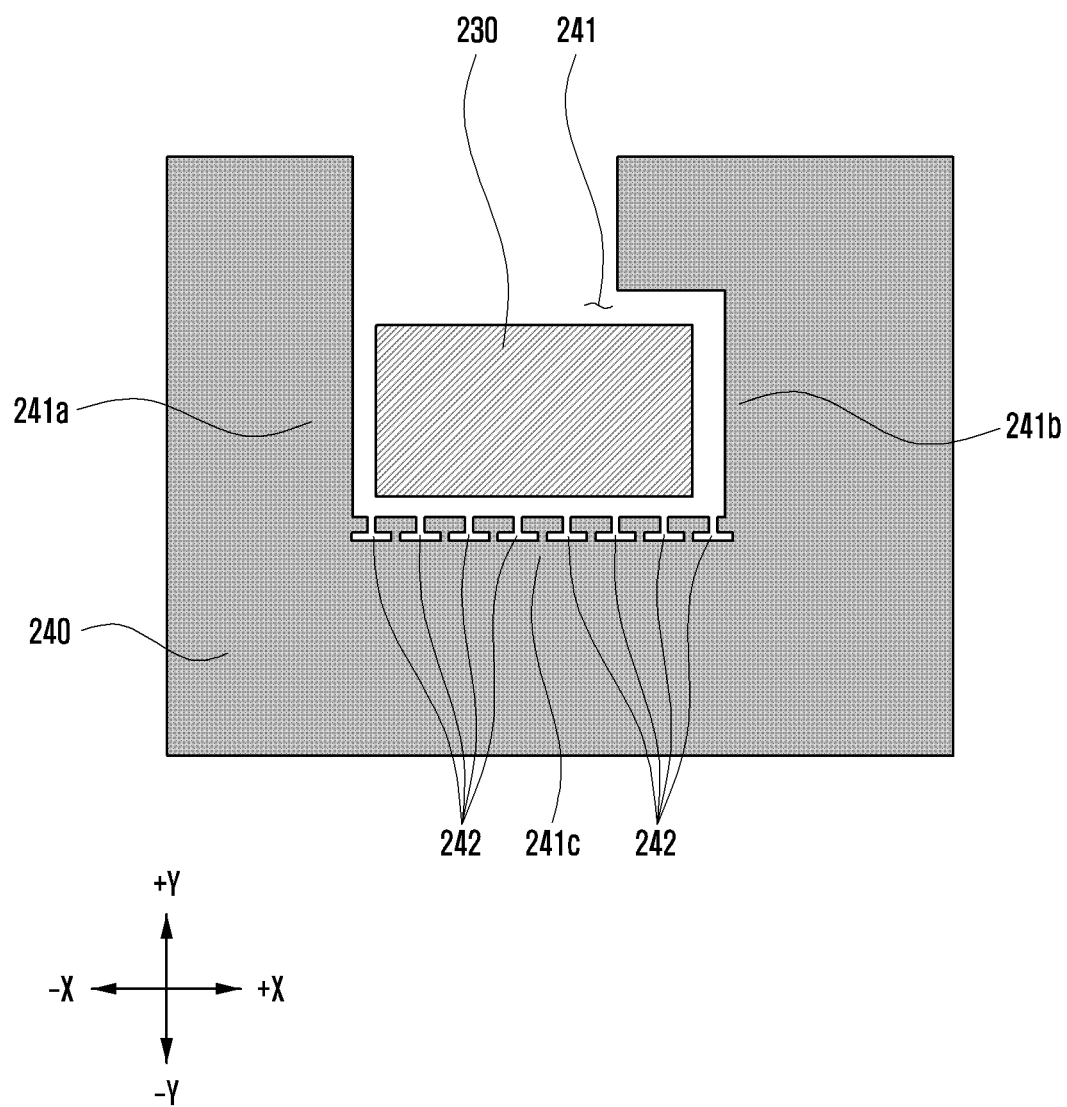

Referring to FIG. 3B, in an embodiment of the disclosure, a plurality of slits 242 may be formed in the third region 241c of the printed circuit board 240. For example, plural slits 242 may be disposed at specified intervals in the third region 241c along the width direction (e.g., x-axis direction) of the printed circuit board 240. Although the printed circuit board 240 is shown as including eight slits 242 in FIG. 3B, this is illustrative and the number of slits 242 included in the printed circuit board 240 may be not limited thereto.

Figure 3C:
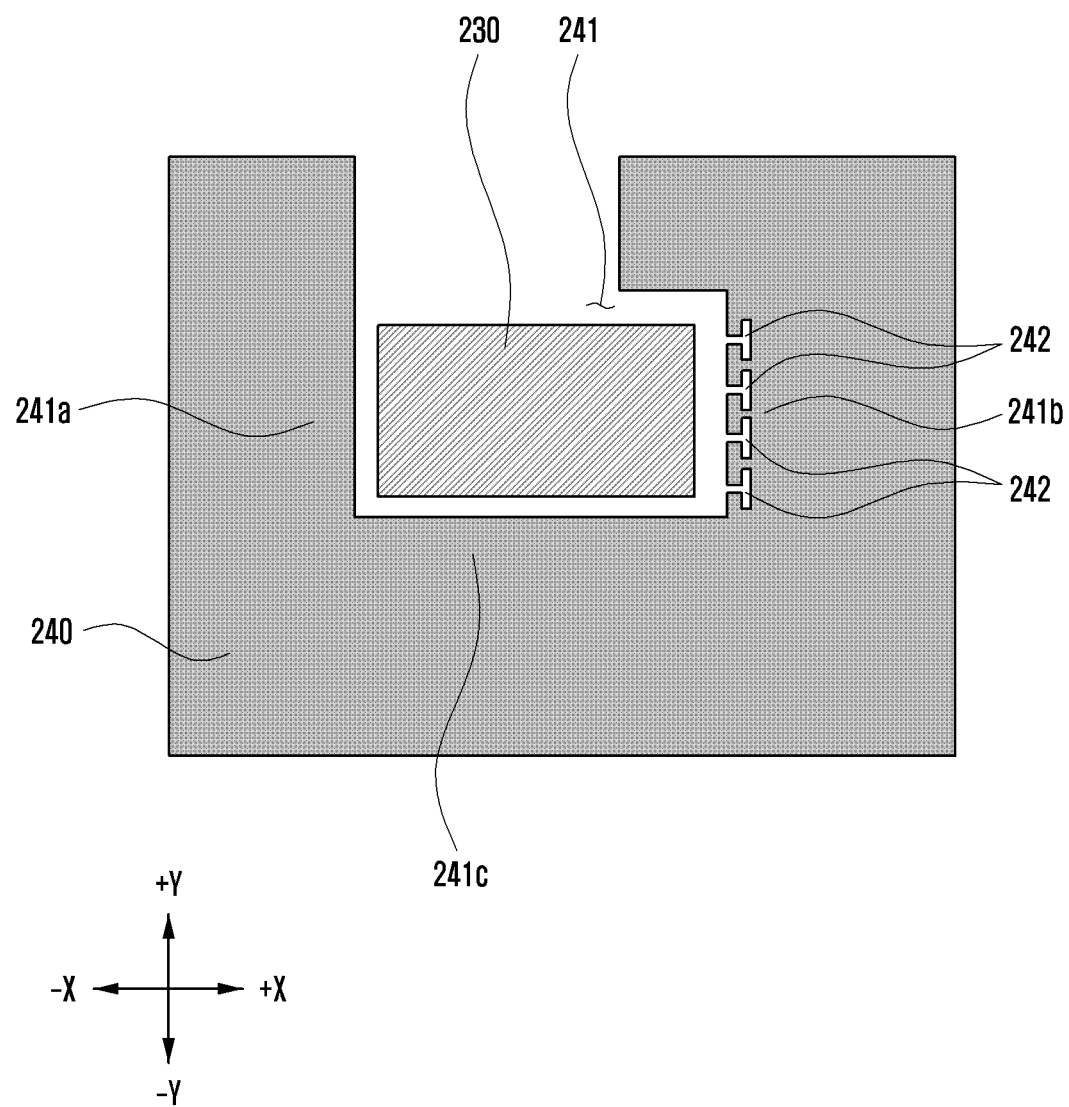

Referring to FIG. 3C, in an embodiment of the disclosure, a plurality of slits 242 may be formed in the second region 241b of the printed circuit board 240. For example, plural slits 242 may be disposed at specified intervals in the second region 241b along the length direction (e.g., y-axis direction) of the printed circuit board 240. Although the printed circuit board 240 is shown as including four slits 242 in FIG. 3C, this is illustrative and the number of slits 242 included in the printed circuit board 240 may be not limited thereto.

Figure 3D:
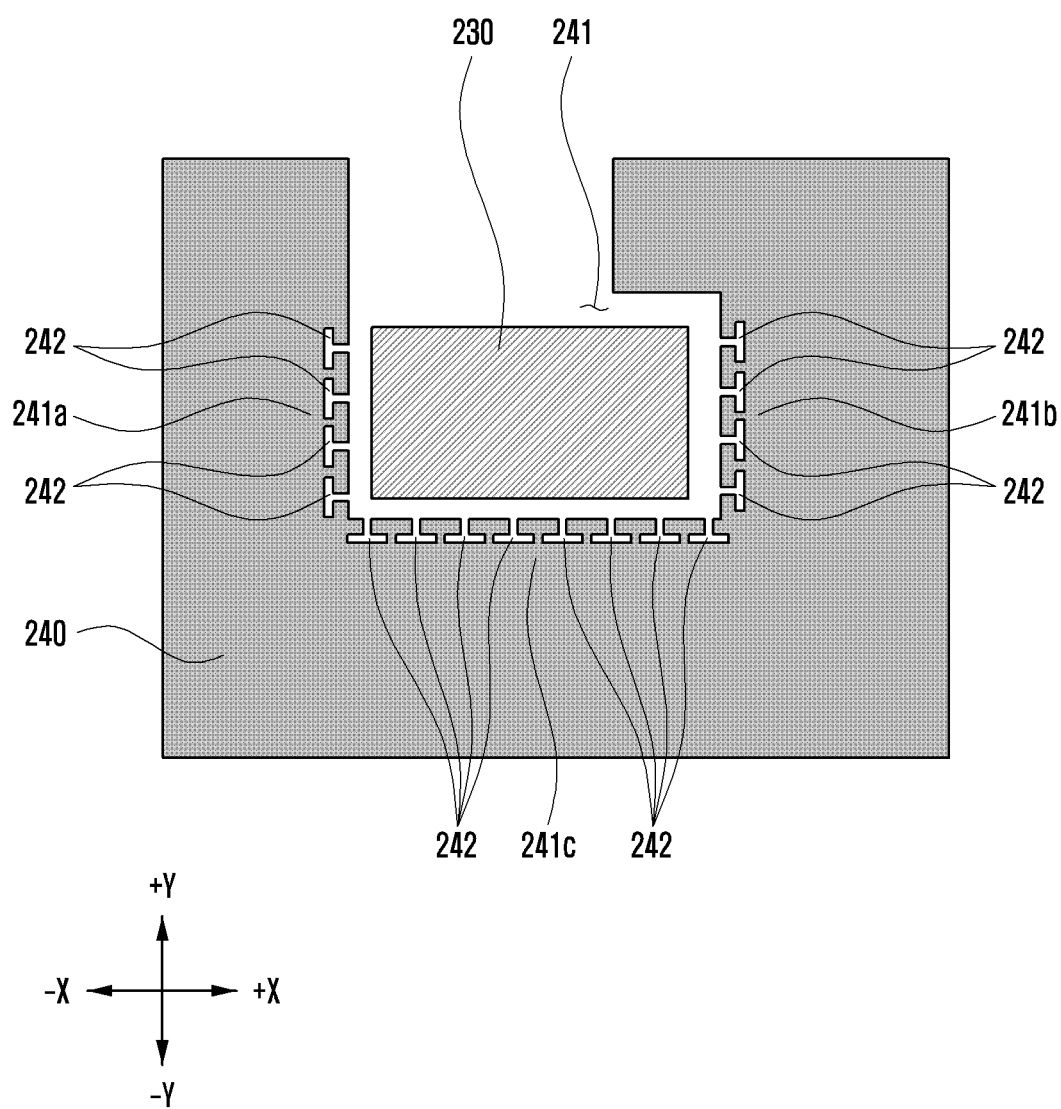

Referring to FIG. 3D, in an embodiment of the disclosure, a plurality of slits 242 may be formed in each of the first region 241a, the second region 241b, and the third region 241c of the printed circuit board 240. For example, plural slits 242 may be disposed at specified intervals in the first region 241a, the second region 241b, and the third region 241c along the width direction (e.g., x-axis direction) or the length direction (e.g., y-axis direction) of the printed circuit board 240.

In an embodiment of the disclosure, among the first region 241a, the second region 241b, and the third region 241c of the printed circuit board 240, plural slits 242 may be formed in a region located relatively close to a component consuming a lot of power (e.g., power consuming component positioned inside the shield can 250 in FIG. 2). For example, when the first region 241a is located closer to the power consuming component than other regions (e.g., second region 241b, third region 241c), a plurality of slits 242 may be formed in the first region 241a.

FIGS. 3A, 3B, 3C and 3D depict that slits 242 are disposed in the first direction, the second direction, and/or the third direction with respect to the electronic component 230, but the position where slits 242 are disposed on the printed circuit board 240 may be not limited thereto. For example, slits 242 may be formed in a region of the printed circuit board 240 positioned in the fourth direction (e.g., positive y-axis direction) with respect to the electronic component 230.

Figure 4:
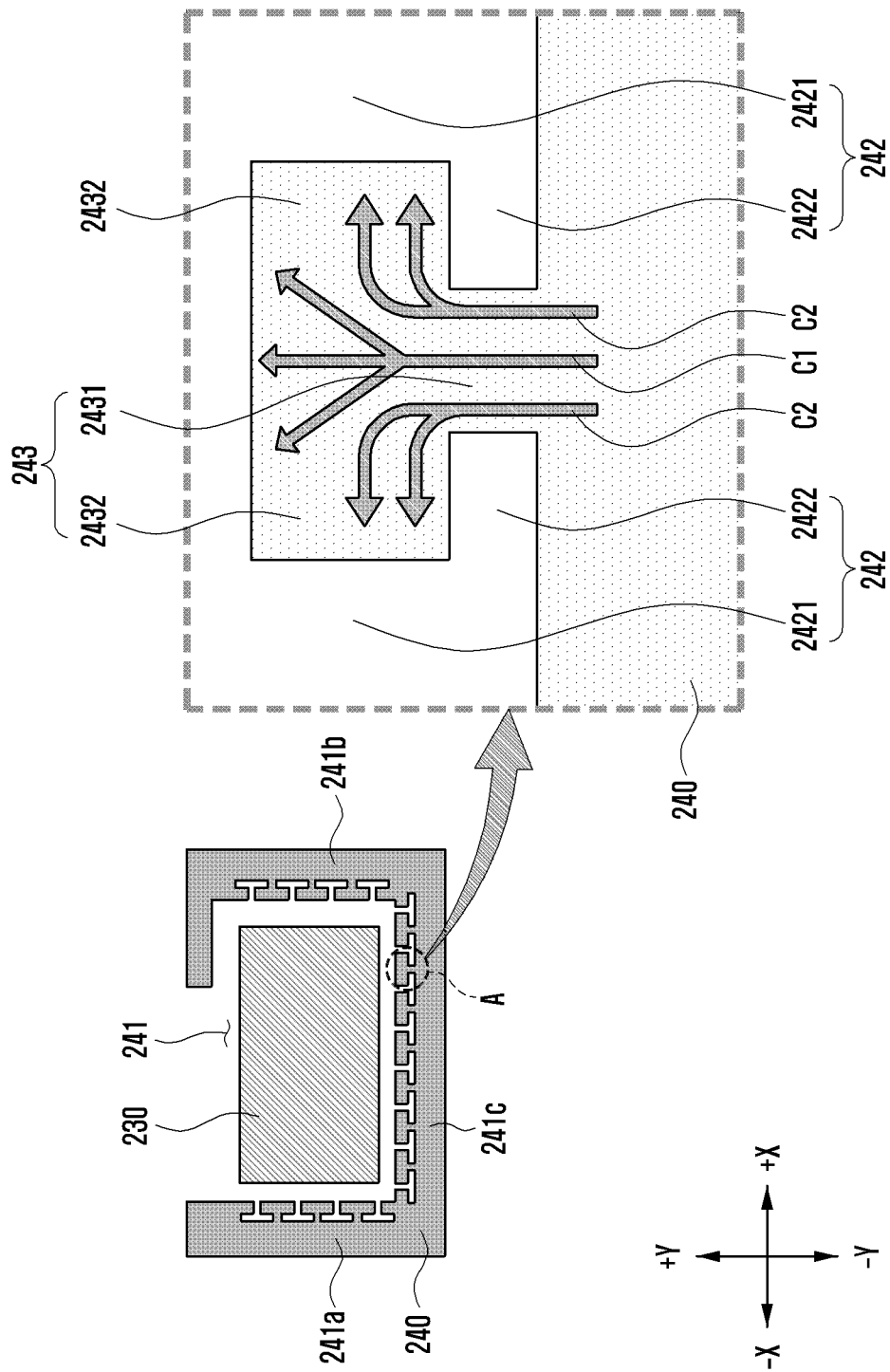
FIG. 4 is a view showing slits and protrusions according to an embodiment of the disclosure.

FIG. 4 is a view showing slits 242 and protrusions 243 according to an embodiment of the disclosure.

In an embodiment of the disclosure, slits 242 and protrusions 243 may be formed in each of the first region 241a, the second region 241b, and the third region 241c of the printed circuit board 240.

Portion 'A' in FIG. 4 indicates an enlarged view of a slit 242 and a protrusion 243 formed in the third region 241c of the printed circuit board 240.

In an embodiment of the disclosure, a slit 242 may include a central slit portion 2421 and/or a symmetric slit portion 2422. The slit 242 may refer to an opening or gap formed at a portion of the printed circuit board 240 and having a pre-specified length.

In an embodiment of the disclosure, the central slit portion 2421 may refer to a portion formed to extend substantially perpendicular to one surface of the printed circuit board 240. For example, when a part of the printed circuit board 240 is extended in the x-axis direction, the central slit portion 2421 may be formed to extend in the y-axis direction perpendicular to the x-axis direction. Referring to FIG. 4, the central slit portion 2421 of the slit 242 positioned in the third direction (e.g., negative y-axis direction) of the electronic component 230 may be formed to extend in a direction perpendicular to a part of the printed circuit board 240 (e.g., y-axis direction).

In an embodiment of the disclosure, the central slit portion 2421 of the slit 242 may refer to a portion formed to extend in a direction away from the electronic component 230. For example, when the electronic component 230 is positioned in the positive y-axis direction with respect to the slit 242, the central slit portion 2421 may be formed to extend toward the negative y-axis direction.

In an embodiment of the disclosure, the central slit portion 2421 may be a portion extended along the center of the slit 242. For example, for a slit 242 positioned in the first region 241a or the second region 241b, the center of the slit 242 indicates the center in the y-axis direction, and the central slit portion 2421 may be formed to extend along the x-axis direction with respect to the center of the slit 242 in the y-axis direction. For a slit 242 positioned in the third region 241c, the center of the slit 242 indicates the center in the x-axis direction, and the central slit portion 2421 may be formed to extend along the y-axis direction with respect to the center of the slit 242 in the x-axis direction.

In an embodiment of the disclosure, the symmetric slit portion 2422 may be formed to extend from an end of the central slit portion 2421 perpendicularly to the direction in which the central slit portion 2421 is extended in a form symmetric about the central slit portion 2421. For example, the symmetric slit portion 2422 of a slit 242 positioned in the third direction (e.g., negative y-axis direction) of the electronic component 230 may be formed to extend, from an end of the central slit portion 2421 toward the negative y-axis direction, in a direction perpendicular to the central slit portion 2421 (e.g., x-axis direction).

In an embodiment of the disclosure, a protrusion 243 may be formed between plural slits 242. The protrusion 243 may be formed by a portion of the printed circuit board 240 that protrudes and is extended in a direction toward the electronic component 230. The protrusion 243 may include a central protrusion portion 2431 and/or a symmetric protrusion portion 2432 at least in part.

In an embodiment of the disclosure, the protrusion 243 may be a portion of the printed circuit board 240 that protrudes and is extended around a slit 242 when the slit 242 is formed at a portion of the printed circuit board 240. For example, the central protrusion portion 2431 may be a portion formed by symmetric slit portions 2422. The symmetric protrusion portion 2432 may be a portion formed by central slit portions 2421. Since the symmetric slit portion 2422 is extended further toward the protrusion 243 compared to the central slit portion 2421, the width (e.g., length in x-axis direction) of the central protrusion portion 2431 may be formed to be smaller than the width (e.g., length in x-axis direction) of the symmetric protrusion portion 2432.

In an embodiment of the disclosure, slits 242 may each be positioned in one direction of a protrusion 243 (e.g., negative x-axis direction relative to the protrusion 243) and in the other direction (e.g., positive x-axis direction relative to the protrusion 243). For example, symmetric slit portions 2422 may each be positioned in one direction of a central protrusion portion 2431 and in the other direction. Central slit portions 2421 may each be positioned in one direction of a symmetric protrusion portion 2432 and in the other direction.

In an embodiment of the disclosure, the central protrusion portion 2431 may be formed by a portion of the printed circuit board 240 that protrudes and is extended in a direction substantially perpendicular to the direction in which the printed circuit board 240 is extended. For example, as indicated by portion 'A' in FIG. 4, the central protrusion portion 2431 may be formed by a portion of the printed circuit board 240 that protrudes and is extended in a direction (e.g., y-axis direction) substantially perpendicular to the direction (e.g., x-axis direction) in which the printed circuit board 240 is extended.

In an embodiment of the disclosure, the symmetric protrusion portion 2432 may be formed to extend in a direction substantially perpendicular to the direction in which the central protrusion portion 2431 is extended, in a form symmetric with respect to the central protrusion portion 2431. For example, the symmetric protrusion portion 2432 may be formed to extend in the negative x-axis direction and the positive x-axis direction from an end of the central protrusion portion 2431 (e.g., the end positioned in the positive y-axis direction of the central protrusion portion 2431) so as to be symmetric about the central protrusion portion 2431.

In an embodiment of the disclosure, the symmetric protrusion portion 2432 may have a symmetrical shape with respect to the central protrusion portion 2431. For example, in the symmetric protrusion portion 2432, the length extended in the negative x-axis direction from the central protrusion portion 2431 and the length extended in the positive x-axis direction may be equal to each other.

Referring to FIG. 4, the symmetric protrusion portion 2432 is illustrated as extending in a rectangular shape, but this is illustrative, and the shape of the symmetric protrusion portion 2432 may be not limited thereto. For example, the symmetric protrusion portion 2432 may be formed to be symmetric with respect to the center of the protrusion 243 in the x-axis direction so as to have one of various shapes (e.g., ellipse, polygon).

In an embodiment of the disclosure, one end of the protrusion 243 may indicate the end of the protrusion 243 positioned closest to the cut region 241. For example, one end of the protrusion 243 in portion 'A' may indicate the end toward the positive y-axis direction.

In an embodiment of the disclosure, a current may flow in the protrusion 243 of the printed circuit board 240. For example, a first current C1 may flow toward one end of the protrusion 243. The first current C1 may flow toward one end of the protrusion 243 along the positive y-axis direction.

In an embodiment of the disclosure, the first current C1 as a return current (C-r, see FIG. 8A) may be a current having a frequency lower than a preset reference value. Referring to FIG. 4, the first current C1 may include a current component flowing in parallel to the y-axis direction and current components flowing in the positive x-axis direction and the negative x-axis direction. The length by which the protrusion 243 is extended (e.g., length extended in y-axis direction in portion 'A') may be formed to a preset length or less, which can prevent formation of an H-field caused by a current component of the first current C1 flowing in parallel to the y-axis direction. Among the first current C1, current components flowing in the positive x-axis direction and the negative x-axis direction have vectors symmetric about the x-axis center and the same scalar so they can cancel each other out.

In an embodiment of the disclosure, one direction of a protrusion 243 may indicate the negative x-axis direction with respect to the protrusion 243, and the other direction of a protrusion 243 may indicate the positive x-axis direction with respect to the protrusion 243.

Referring to FIG. 4, a second current C2 may flow in a direction where the protrusion 243 is extended (e.g., positive y-axis direction) and then flow in a direction (e.g., x-axis direction) perpendicular to the direction where the protrusion 243 is extended (e.g., positive y-axis direction). For example, the second current C2 may flow along a direction where the symmetric protrusion portion 2432 is extended (e.g., negative x-axis direction or positive x-axis direction).

In an embodiment of the disclosure, the second current C2 may include currents flowing in opposite directions along the direction where the symmetric protrusion portion 2432 is extended. For example, with respect to the x-axis center of the symmetric protrusion portion 2432, the second current C2 may flow toward the negative x-axis direction, and the other second current C2 may flow toward the positive x-axis direction.

In an embodiment of the disclosure, when viewed from a position where the first current C1 and the second current C2 are incident on the protrusion 243, the impedances of the symmetric protrusion portion 2432 in the negative x-axis direction and in the positive x-axis direction with respect to the x-axis center of the protrusion 243 may be formed to be the same.

In an embodiment of the disclosure, the second currents C2 flowing in opposite directions along the direction where the symmetric protrusion portion 2432 is extended may have vectors symmetric about the x-axis center of the symmetric protrusion portion 2432 and the same scalar. The second currents C2 having symmetric vectors and the same scalar flow in opposite directions, so that the H-fields caused by the second currents C2 may cancel each other out.

Figure 5:
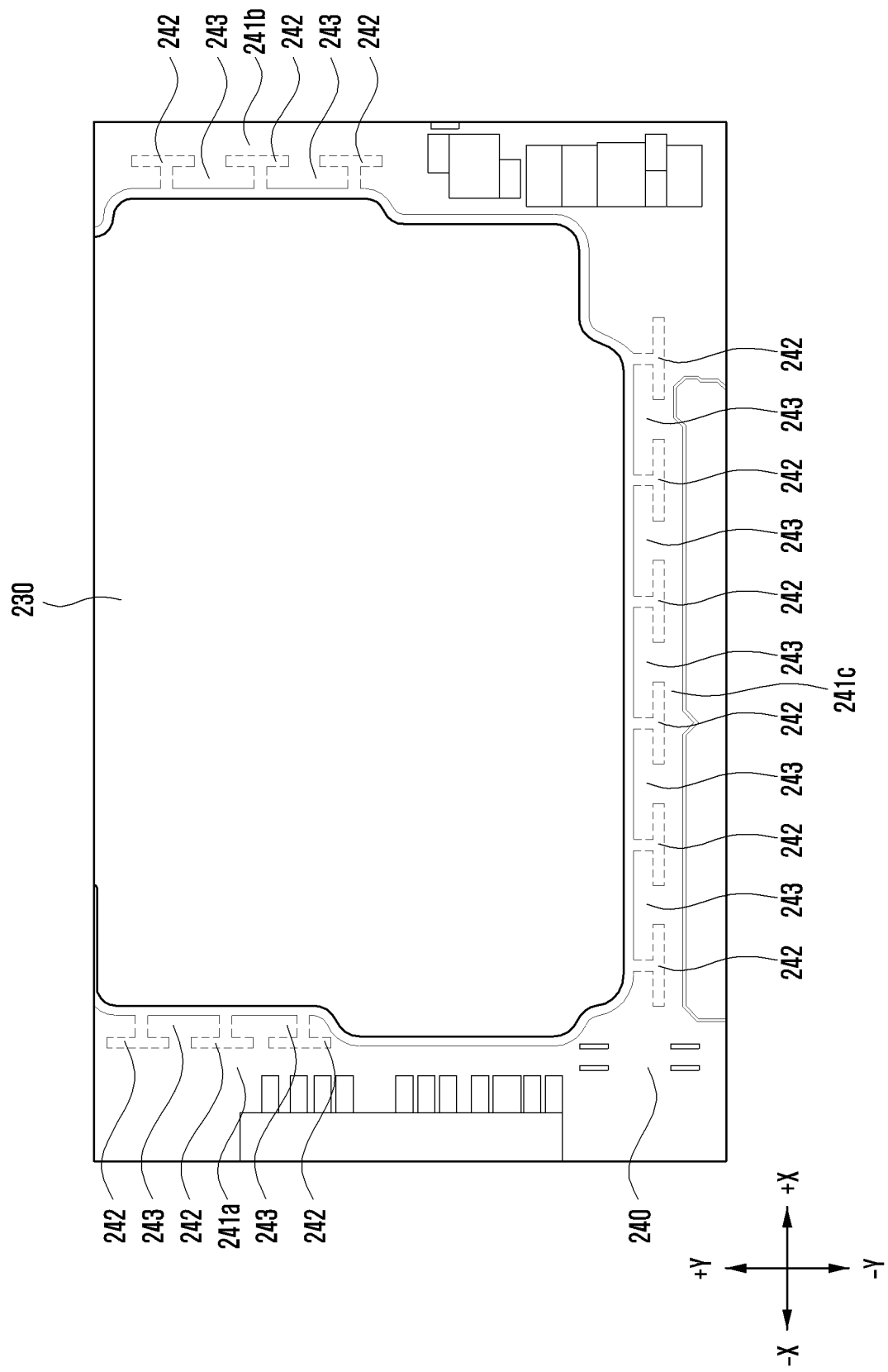
FIG. 5 is a view illustrating a printed circuit board including slits according to an embodiment of the disclosure.

FIG. 5 is a view illustrating a printed circuit board 240 including slits 242 according to an embodiment of the disclosure.

In an embodiment of the disclosure, the printed circuit board 240 may be disposed to surround at least a portion of the electronic component 230. For example, the printed circuit board 240 may be disposed to be spaced apart from the electronic component 230 in a first direction, a second direction, and/or a third direction of the electronic component 230.

Referring to FIG. 5, a first region 241a, a second region 241b, and/or a third region 241c of the printed circuit board 240 may be formed around the electronic component 230. For example, the first region 241a may be positioned in a negative x-axis direction with respect to the electronic component 230, and the second region 241b may be positioned in a positive x-axis direction with respect to the electronic component 230. The third region 241c may be positioned in a negative y-axis direction with respect to the electronic component 230.

Referring to FIG. 5, a plurality of slits 242 may be formed in each of the first region 241a, the second region 241b, and the third region 241c of the printed circuit board 240. For example, three slits 242 may be disposed at intervals in the y-axis direction in each of the first region 241a and the second region 241b of the printed circuit board 240. In the third region 241c of the printed circuit board 240, six slits 242 may be disposed at intervals in the x-axis direction.

The number of slits 242 shown in FIG. 5 is illustrative, and the number of slits 242 formed on the printed circuit board 240 may be not limited thereto. For example, each of the first region 241a and the second region 241b of the printed circuit board 240 may include four or more slits 242.

In an embodiment of the disclosure, a protrusion 243 may be formed between plural slits 242. For example, the protrusion 243 may be formed by a portion of the printed circuit board 240 that protrudes in one direction between two slits 242 while the slits 242 are formed in the printed circuit board 240. In the first region 241a, the protrusion 243 may be formed to extend in the positive x-axis direction, in the second region 241b, the protrusion 243 may be formed to extend in the negative x-axis direction. In the third region 241c, the protrusion 243 may be formed to extend in the positive y-axis direction.

Referring to FIG. 5, a plurality of protrusions 243 may be formed in each of the first region 241a, the second region 241b, and the third region 241c of the printed circuit board 240. For example, two protrusions 243 may be disposed at intervals in the y-axis direction in each of the first region 241a and the second region 241b of the printed circuit board 240. In the third region 241c of the printed circuit board 240, five protrusions 243 may be disposed at intervals in the x-axis direction. Each protrusion 243 may be positioned between two slits 242.

In an embodiment of the disclosure, slits 242 may be disposed in a spare space (e.g., empty space where no electronic component is arranged on the printed circuit board 240) of a part of the printed circuit board 240. In FIG. 5, since the third region 241c of the printed circuit board 240 includes more spare space than the first region 241a and the second region 241b, the third region 241c may include more slits 242 than the first region 241a and the second region 241b.

Figure 6:
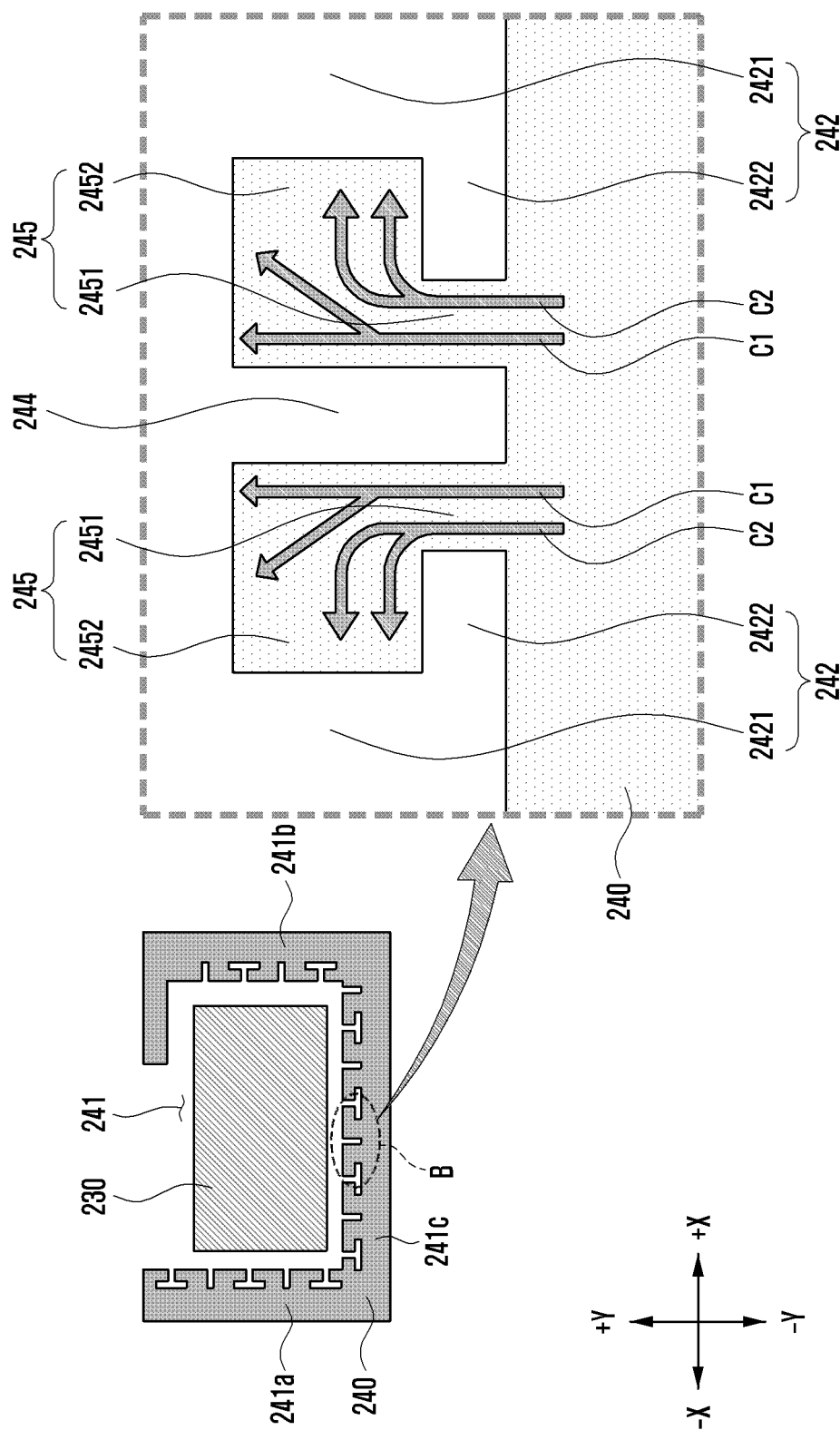
FIG. 6 is a view illustrating a printed circuit board including a first slit and a second slit according to an embodiment of the disclosure.

FIG. 6 is a view illustrating a printed circuit board including a first slit 242 and a second slit 244 according to an embodiment of the disclosure.

In an embodiment of the disclosure, the printed circuit board 240 may include a first slit 242 and/or a second slit 244. For example, first slits 242 and second slits 244 may be formed in each of the first region 241a, the second region 241b, and the third region 241c of the printed circuit board 240.

In an embodiment of the disclosure, the first slit 242 may refer to the slit 242 shown in FIG. 4. For example, the first slit 242 shown in FIG. 6 and the slit 242 shown in FIG. 4 may have the same shape. The first slit 242 may include a central slit portion 2421 and a symmetric slit portion 2422.

In an embodiment of the disclosure, the second slit 244 may be formed to extend in a direction away from the electronic component 230 and/or the cut region 241 on the printed circuit board 240.

In an embodiment of the disclosure, the first slit 242 and the second slit 244 may be alternately disposed along one direction of the printed circuit board 240. For example, in each of the first region 241a and the second region 241b, the first slit 242 and the second slit 244 may be alternately arranged at intervals along the length direction (e.g., y-axis direction) of the printed circuit board 240. In the third region 241c, the first slit 242 and the second slit 244 may be alternately arranged at intervals along the width direction (e.g., x-axis direction) of the printed circuit board 240.

In an embodiment of the disclosure, a protrusion 245 may be formed between the first slit 242 and the second slit 244 that are alternately disposed along one direction of the printed circuit board 240. The protrusion 245 may include an extension portion 2451 and a symmetric portion 2452.

Portion 'B' of FIG. 6 indicates an enlarged view of the protrusion 245 formed on the printed circuit board 240 according to an embodiment.

In an embodiment of the disclosure, the extension portion 2451 of a protrusion 245 may be formed by a portion of the printed circuit board 240 that protrudes and is extended in a direction substantially perpendicular to the direction where the printed circuit board 240 is extended. For example, in the third region 241c of the printed circuit board 240, the extension portion 2451 of the protrusion 245 may be formed by a portion of the printed circuit board 240 that is extended in a y-axis direction substantially perpendicular to the x-axis direction being the direction where the printed circuit board 240 is extended.

In an embodiment of the disclosure, the extension portion 2451 of the protrusion 245 may protrude and extend in a direction where a portion of the printed circuit board 240 faces the electronic component 230. For example, since the electronic component 230 is positioned in the positive y-axis direction with respect to the third region 241c of the printed circuit board 240, the extension portion 2451 may be extended in the positive y-axis direction.

In an embodiment of the disclosure, the symmetric portion 2452 of the protrusion 245 may be extended from one end of the protrusion 245 in a direction perpendicular to the direction where the protrusion 245 is extended. For example, as indicated by portion 'B', the symmetric portion 2452 may be formed to extend from one end (e.g., end toward positive y-axis direction) of the protrusion 245 in a positive x-axis direction or a negative x-axis direction.

In an embodiment of the disclosure, two protrusions 245 may be disposed with a second slit 244 interposed therebetween. Two protrusions 245 disposed with a second slit 244 interposed therebetween may be formed to be symmetric to each other with respect to the second slit 244.

In an embodiment of the disclosure, the symmetric portions 2452 of one protrusion 245 and another protrusion 245 spaced apart from each other with a second slit 244 interposed therebetween may be extended in opposite directions. For example, as indicated by portion 'B' of FIG. 6, the symmetric portion 2452 of one protrusion 245 may be extended toward the negative x-axis direction, and the symmetric portion 2452 of another protrusion 245 spaced apart from the one protrusion 245 in the positive x-axis direction may be extended toward the positive x-axis direction.

In an embodiment of the disclosure, one end of a protrusion 245 may refer to the end of the protrusion 245 located closest to the cut region 241. For example, in portion 'B', one end of the protrusion 245 may indicate the end of the protrusion 245 toward the positive y-axis direction.

In an embodiment of the disclosure, a current may flow in the protrusion 245 of the printed circuit board 240. For example, a first current C1 may flow along a positive y-axis direction toward one end of the protrusion 245.

In an embodiment of the disclosure, the first current C1 as a return current (C-r, see FIG. 8A) may be a current having a frequency lower than a preset reference value. The length of the protrusion 245 in the y-axis direction may be formed to be less than a preset length, which can prevent formation of an H-field due to the first current C1.

Referring to FIG. 6, the second current C2 may flow in a direction where the extension portion 2451 is extended (e.g., positive y-axis direction) and then flow in a direction (e.g., x-axis direction) perpendicular to the direction where the protrusion 245 is extended (e.g., positive y-axis direction).

In an embodiment of the disclosure, the second current C2 may flow along the direction where the symmetric portion 2452 of a protrusion 245 is extended. For example, the second current C2 may flow toward a negative x-axis direction or a positive x-axis direction along the direction where the symmetric portion 2452 of the protrusion 245 is extended.

In an embodiment of the disclosure, the second current C2 may include currents flowing in opposite directions along the direction in which the symmetric portion 2452 is extended. For example, for one symmetric portion 2452 and another symmetric portion 2452 positioned with a second slit 244 interposed therebetween, the second current C2 may flow toward the negative x-axis direction in the one symmetric portion 2452, and the second current C2 may flow toward the positive x-axis direction in the other symmetric portion 2452.

In an embodiment of the disclosure, the second currents C2 flowing in opposite directions have symmetric vectors and the same scalar, so that the H-fields caused by the second currents C2 may cancel each other out.

Figure 7:
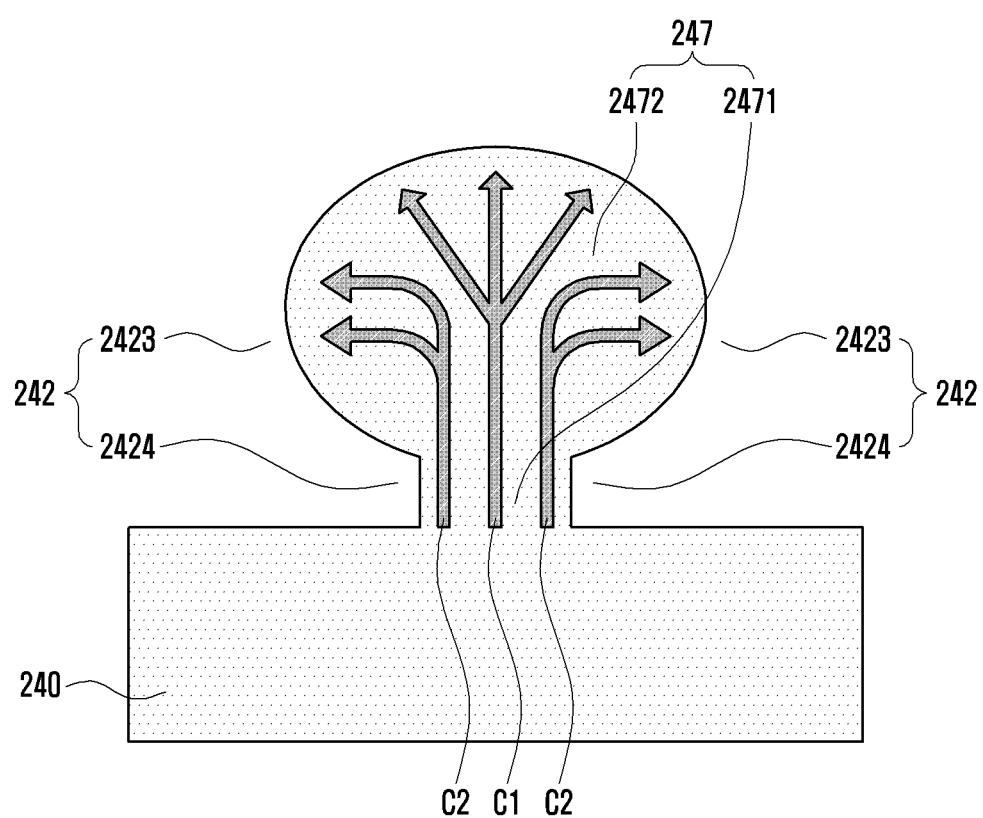
FIG. 7 is a view illustrating a protrusion including a circular protrusion portion according to an embodiment of the disclosure.

FIG. 7 is a view illustrating a protrusion 247 including a circular protrusion portion 2472 according to an embodiment of the disclosure.

In an embodiment of the disclosure, a slit 242 formed in the printed circuit board 240 may include a concave portion 2423 and/or a concave extension portion 2424. The concave portion 2423 may be a portion formed in a shape in which one side and the other side of the slit 242 are concave in a direction perpendicular to a direction where the slit 242 is extended.

Referring to FIG. 7, the concave portion 2423 may have a shape concave toward the center of the slit 242 toward a negative x-axis direction or a positive x-axis direction.

In an embodiment of the disclosure, the concave extension portion 2424 may be formed by a portion that is extended from one end of the concave portion 2423 toward the printed circuit board 240.

In an embodiment of the disclosure, a protrusion 247 including a central protrusion portion 2471 and/or the circular protrusion portion 2472 may be formed between two slits 242 including the concave portion 2423.

In an embodiment of the disclosure, the protrusion 247 may be formed by a portion of the printed circuit board 240 that is extended in one direction. For example, in FIG. 7, the protrusion 247 may be formed by a portion of the printed circuit board 240 that is extended toward a positive y-axis direction.

In an embodiment of the disclosure, the central protrusion portion 2471 may be a portion of the printed circuit board 240 that protrudes and is extended in a direction perpendicular to the direction where the printed circuit board 240 is extended. For example, when the printed circuit board 240 is extended in the x-axis direction, the central protrusion portion 2471 may protrude and extend toward the y-axis direction perpendicular to the x-axis direction.

In an embodiment of the disclosure, the protrusion 247 may include a circular protrusion portion 2472 formed in a circular shape at one end of the central protrusion portion 2471. For example, the circular protrusion portion 2472 may be formed in a circular shape at an end of the central protrusion portion 2471 toward the positive y-axis direction.

FIG. 7 shows a case where the protrusion 247 includes a circular protrusion portion 2472, but this is illustrative, and a non-circular polygonal protrusion portion may be formed at one end of the central protrusion portion 2471. For example, one end of the central protrusion portion 2471 may be formed to have a polygonal (e.g., pentagonal, hexagonal) shape that is symmetric with respect to a center line of the central protrusion portion 2471 in the x-axis direction.

In an embodiment of the disclosure, a current may flow in the protrusion 247 of the printed circuit board 240. For example, a first current C1 may flow along the direction where the protrusion 247 is extended. For example, the first current C1 may flow toward a positive y-axis direction.

In an embodiment of the disclosure, the first current C1 as a return current (C-r, see FIG. 8A) may be a current having a frequency lower than a preset reference value. The length of the protrusion 247 in the y-axis direction may be formed to be less than a preset length, which can prevent formation of an H-field due to the first current C1.

Referring to FIG. 7, a second current C2 may flow toward a direction where the protrusion 247 is extended (e.g., positive y-axis direction) and then flow in a direction (e.g., x-axis direction) perpendicular to the direction where the protrusion 247 is extended (e.g., positive y-axis direction).

In an embodiment of the disclosure, the second current C2 may flow toward one side and the other side of the circular protrusion portion 2472 of the protrusion 247. For example, the second current C2 may flow in the negative x-axis direction being one direction of the circular protrusion portion 2472 of the protrusion 245 or may flow toward the positive x-axis direction being the other direction of the circular protrusion portion 2472.

In an embodiment of the disclosure, the second current C2 flowing in one direction of the circular protrusion portion 2472 and the second current C2 flowing in the other direction of the circular protrusion portion 2472 have symmetric vectors and the same scalar, so that the H-fields caused by the second currents C2 may cancel each other out.

FIGS. 8A, 8B, 8C and 8D are diagrams illustrating a return current C-r generated on a printed circuit board 240 and an equivalent circuit according to various embodiments of the disclosure.

Figure 8A:
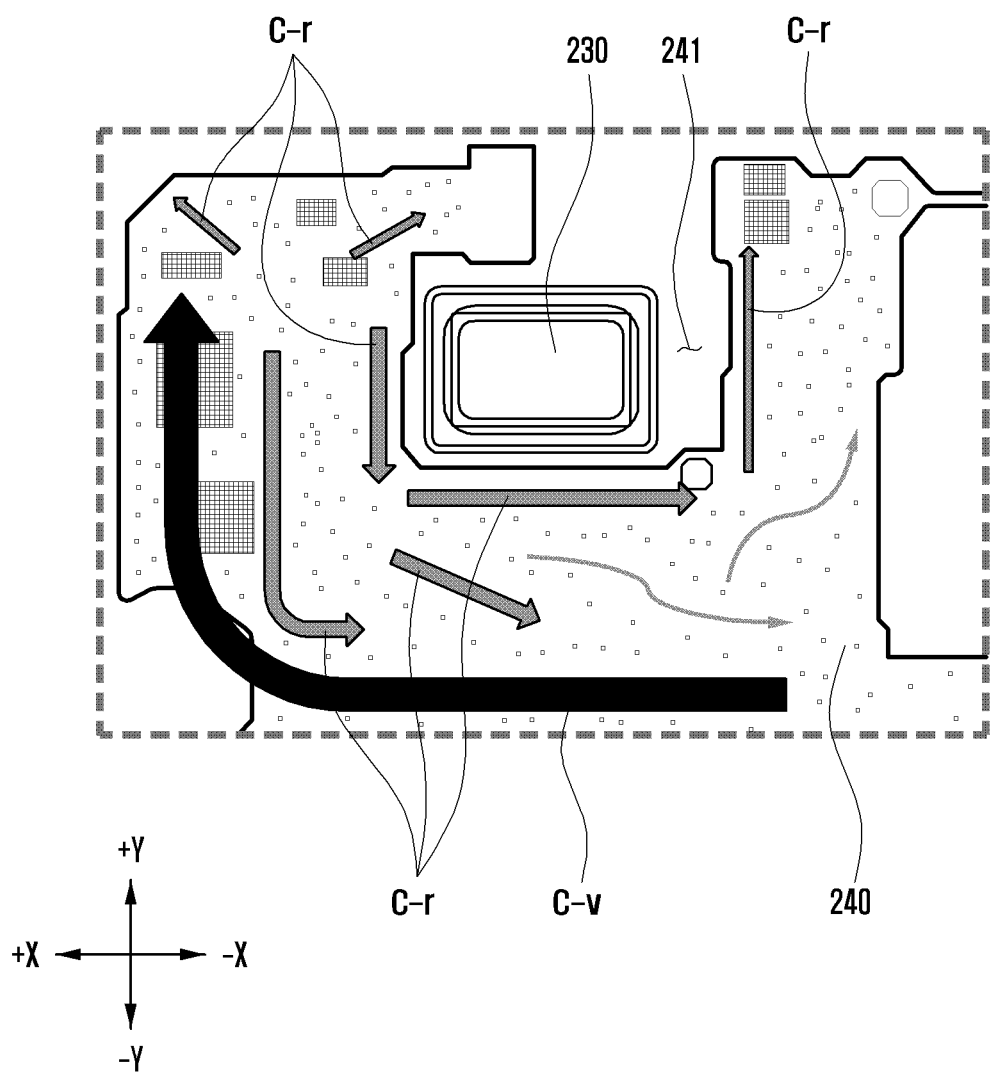
FIGS. 8A, 8B, 8C and 8D are diagrams illustrating a return current generated on a printed circuit board and an equivalent circuit according to various embodiments of the disclosure.

FIG. 8A is a schematic diagram illustrating a return current C-r generated in the printed circuit board 240 when no slit 242 (see FIG. 4) is formed around the cut region 241.

With reference to FIG. 8A, a battery current C-v generated from the battery 210 (see FIG. 2) may flow toward a power consuming component positioned on one surface of the printed circuit board 240 (e.g., power consuming component positioned inside the shield can 250 in FIG. 2). For example, the connector (e.g., the battery connector 270 in FIG. 2) connected to the battery 210 has a relatively high potential and the power consuming component has a relatively low potential, so that the battery current C-v may flow toward the power consuming component.

A return current C-r may be generated due to the flow of the battery current C-v. The return current C-r may flow from the power consuming component toward a portion (e.g., ground portion) of the printed circuit board 240. When no slit 242 (see FIG. 4) is formed around the cut region 241, the generated return current C-r may flow around the cut region 241.

Figure 8B:
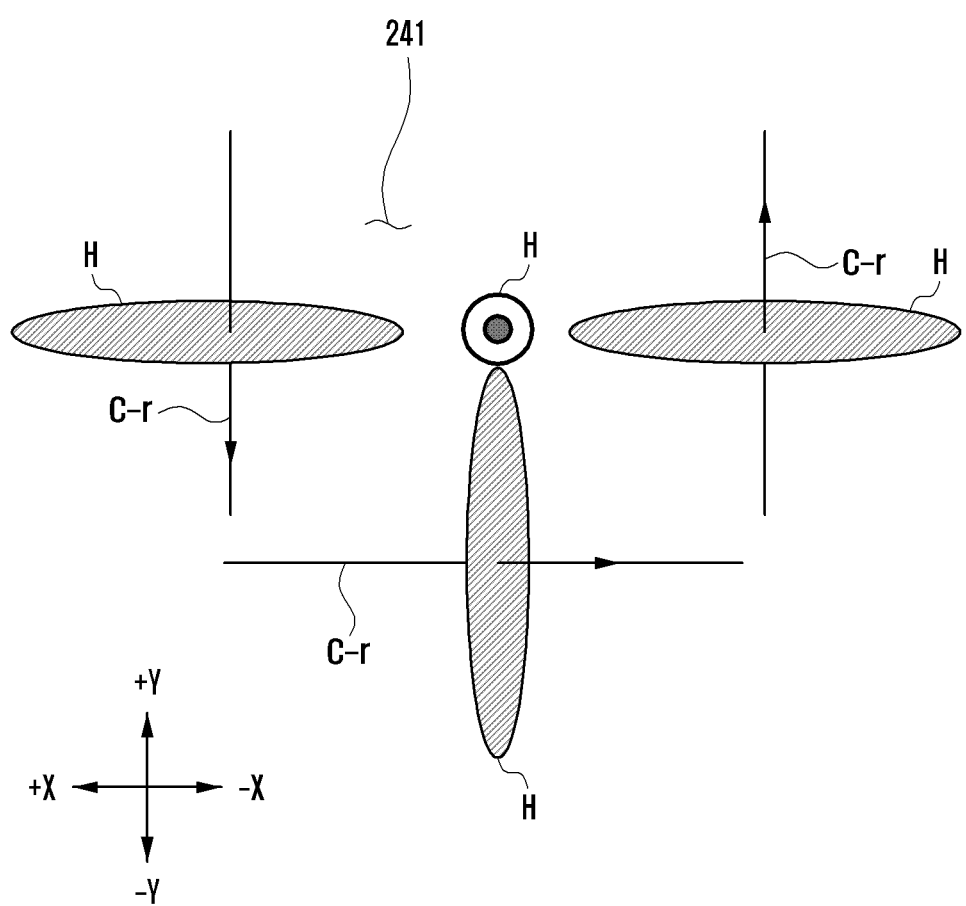

FIG. 8B is a diagram illustrating an H-field H generated due to a return current C-r when no slit 242 is formed around the cut region 241.

When no slit 242 (see FIG. 4) is formed around the cut region 241, a return current C-r flowing around the cut region 241 may be generated. For example, the return current C-r may flow along the outer circumference of the cut region 241 in a negative y-axis direction, positive x-axis direction, and positive y-axis direction in that order.

When no slit 242 (see FIG. 4) is formed around the cut region 241, an H-field H may be formed in at least a part of the cut region 241 due to the return current C-r. An H-field H may be formed in a direction perpendicular to the flowing direction of the return current C-r.

For example, with reference to FIG. 8B, an H-field H may be formed along the circumference of a circle formed with respect to the flowing direction of the return current C-r. The H-field H due to the return current C-r may be formed toward a direction coming from one surface of the cut region 241 as indicated in FIG. 8B.

Figure 8C:
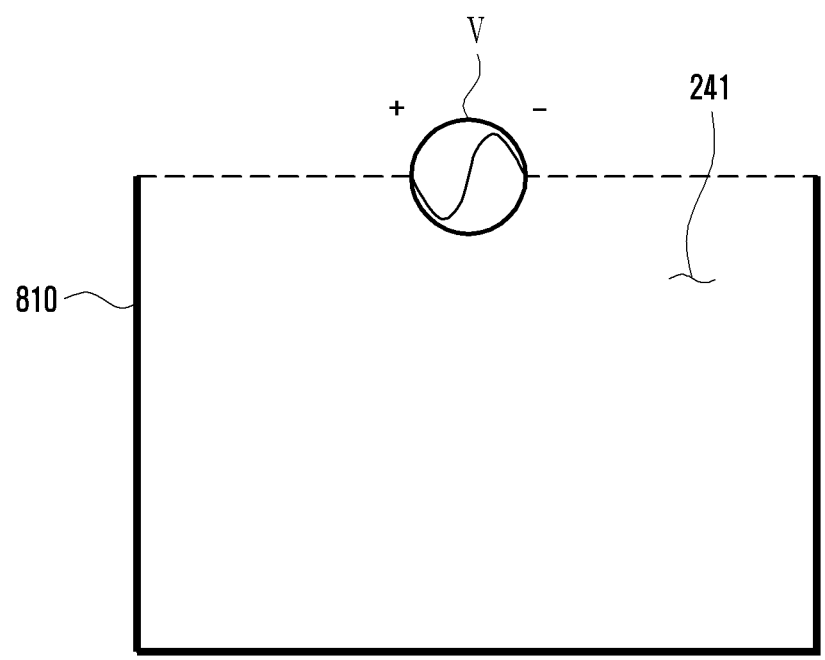

FIG. 8C is a diagram illustrating a first circuit 810 being an equivalent circuit formed around the cut region 241 when no slit 242 (see FIG. 4) is formed around the cut region 241.

When the printed circuit board 240 (see FIG. 4) around the cut region 241 does not include a slit 242, a first circuit 810 through which a current can flow may be formed around the cut region 241. The first circuit 810 may include a voltage source V, but may not include a separate resistor therein. Since the first circuit 810 does not include a resistor, a current can flow in the first circuit 810 without hindrance.

Figure 8D:
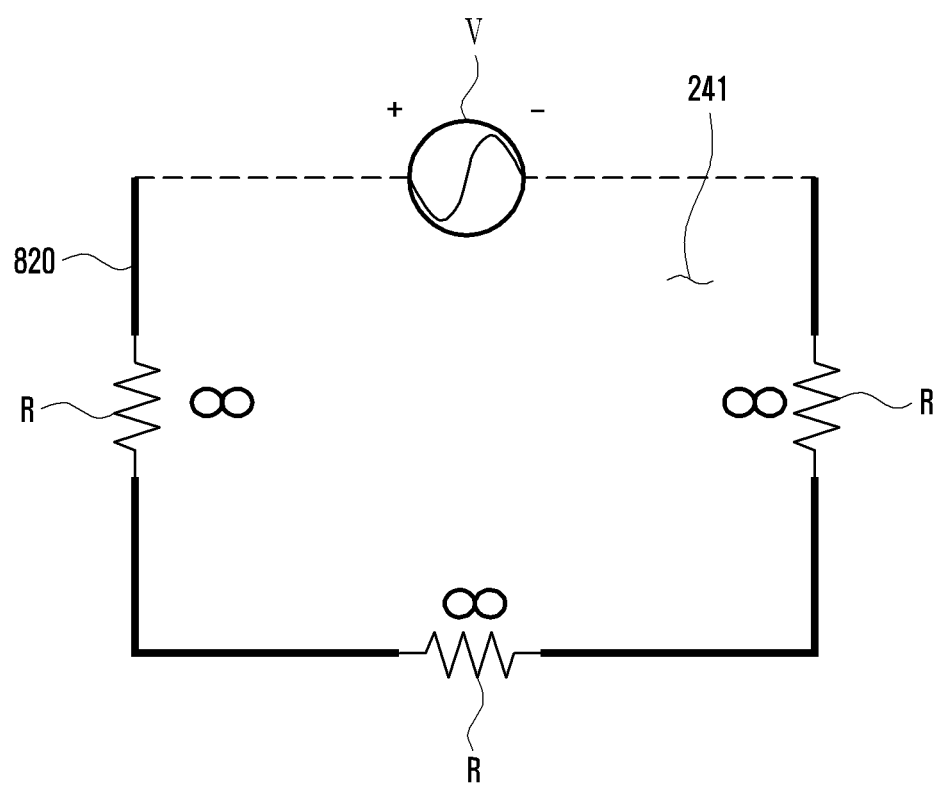

FIG. 8D is a diagram illustrating a second circuit 820 being an equivalent circuit formed around the cut region 241 when slits 242 (see FIG. 4) are formed around the cut region 241.

When the printed circuit board 240 (see FIG. 4) around the cut region 241 includes slits 242 (see FIG. 4), no current may flow around the cut region 241. With reference to FIG. 4, when the printed circuit board 240 includes slits 242, protrusions 243 are formed on a part of the printed circuit board 240, and currents flowing in opposite directions along symmetric protrusion portions 2432 of the protrusions 243 may be canceled out. As the current is canceled in the protrusions 243 and the flow of current is hindered, if represented as an equivalent circuit diagram, this may be represented as a second circuit 820 including a resistor R formed around the cut region 241.

In an embodiment of the disclosure, the second circuit 820 includes a voltage source V and a resistor R, and the resistor R has an infinite value, which can prevent a current from flowing inside the second circuit 820. The resistor R in the second circuit 820 may indicate protrusions 243 (see FIG. 4) of the printed circuit board 240 (see FIG. 4) formed through slits 242 (see FIG. 4). The resistor R in the second circuit 820 may mean that the protrusions 243 (see FIG. 4) impede the flow of current around the cut region 241.

Figure 9A:
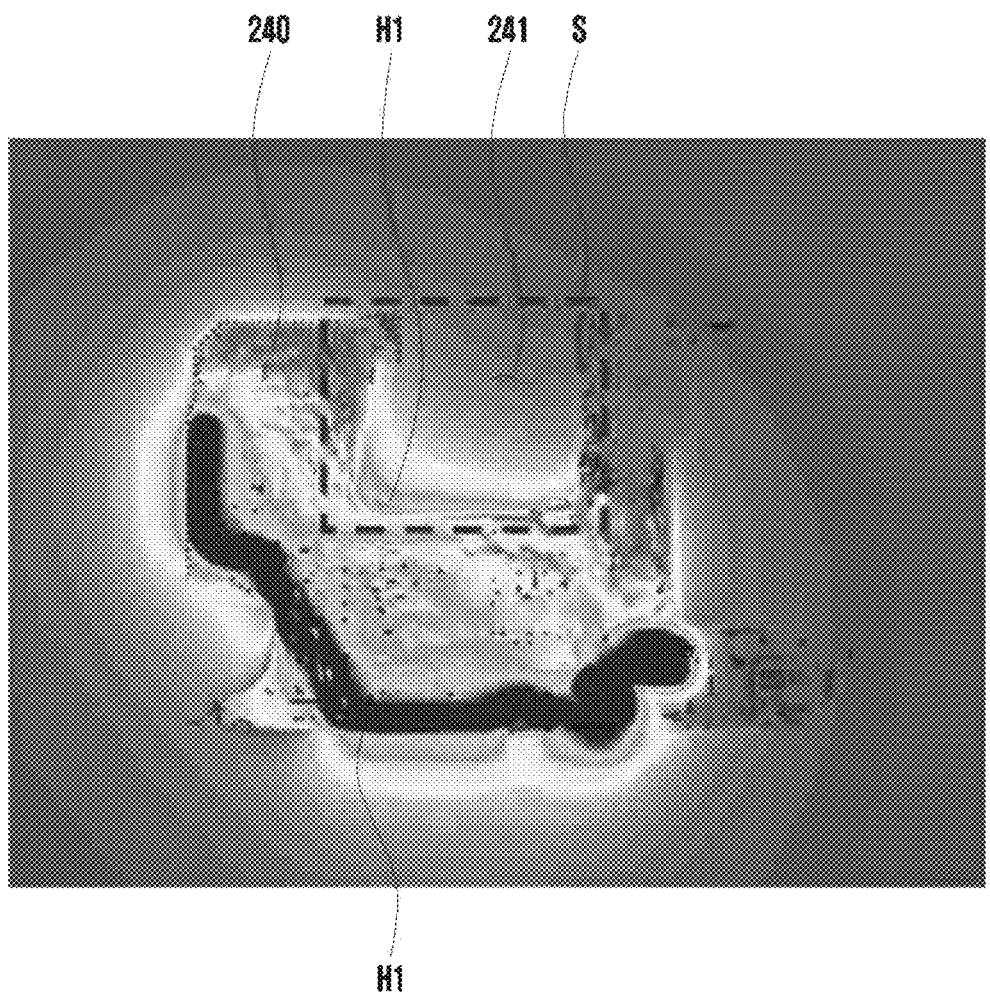
FIGS. 9A and 9B are diagrams illustrating the intensity of the H-field generated on a printed circuit board according to various embodiments of the disclosure.
Figure 9B:
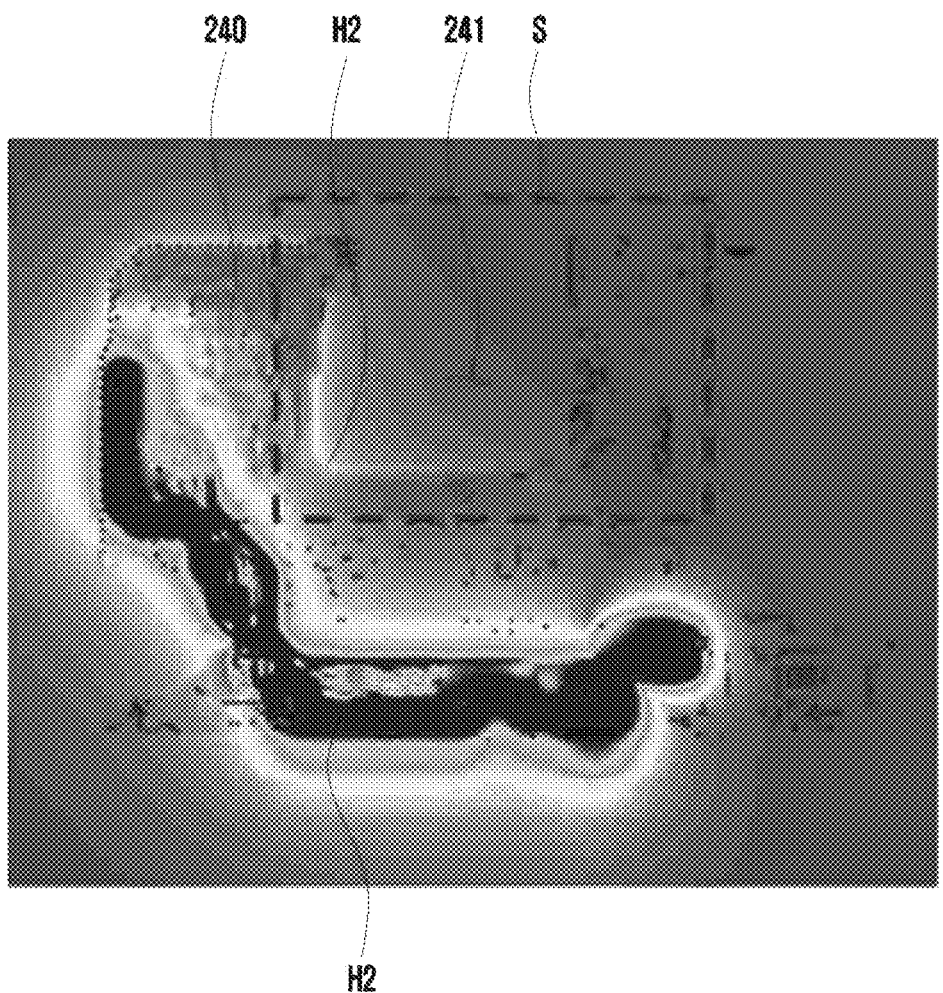

FIGS. 9A and 9B are diagrams illustrating the intensity of the H-field (H1, H2) generated on the printed circuit board 240 according to various embodiments of the disclosure.

FIG. 9A is a diagram showing a simulation result for the intensity of an H-field H1 generated on the printed circuit board 240 and therearound when the printed circuit board 240 does not include a slit 242 (see FIG. 4) around the cut region 241.

FIG. 9B is a diagram showing a simulation result for the intensity of an H-field H2 generated on the printed circuit board 240 and therearound when the printed circuit board 240 includes slits 242 (see FIG. 4) around the cut region 241.

Box lines S in FIGS. 9A and 9B indicate a portion where the cut region 241 is positioned in the printed circuit board 240.

In an embodiment of the disclosure, the H-field H1 or H2 may refer to a magnetic field generated by a current flowing in the printed circuit board 240.

Referring to FIGS. 9A and 9B, a portion where the intensity of the H-field H1 or H2 is strong may be displayed brighter on the drawing than a portion where the intensity of the H-field H1 or H2 is not strong. For example, a portion where the intensity of the H-field H1 or H2 is relatively strong may be displayed in relatively bright colors (e.g., green, yellow, red) on the drawing, a portion where the intensity of the H-field H1 or H2 is relatively weak may be displayed in relatively dark colors (e.g., blue) on the drawing.

In an embodiment of the disclosure, when the printed circuit board 240 includes slits 242 (see FIG. 4) around the cut region 241, compared to the case where the printed circuit board 240 does not include a slit 242 (see FIG. 4) around the cut region 241, the intensity of the H-field H1 or H2 formed around the cut region 241 may be weak. When the printed circuit board 240 includes slits 242 (see FIG. 4) around the cut region 241, as the intensity of the H-field H1 or H2 formed around the cut region 241 is relatively weak, the brightness around the cut region 241 in FIG. 9A may be formed to be higher than the brightness around the cut region 241 in FIG. 9B.

In an embodiment of the disclosure, the printed circuit board 240 including slits 242 (see FIG. 4) around the cut region 241 makes the intensity of the H-field H2 formed in the cut region 241 relatively weak, which can prevent or reduce malfunction of the electronic component 230 including a coil (see FIG. 4) disposed in the cut region 241.

An electronic device 200 according to an embodiment of the disclosure may include an electronic component 230 including a coil therein, and a printed circuit board 240 that is disposed to surround at least a part of the electronic component 230 and includes plural slits 242 disposed at preset intervals in at least one of regions facing the electronic component 230, wherein each of the plural slits 242 may include a central slit portion 2421 extended along the center of the slit 242 and a symmetric slit portion 2422 extended to be symmetric with respect to the central slit portion 2421.

In an embodiment of the disclosure, the printed circuit board 240 may include a first region positioned to be spaced apart in a first direction of the electronic component 230 and facing the electronic component 230, a second region positioned to be spaced apart from the electronic component 230 in a second direction opposite to the first direction and facing the electronic component 230, and a third region positioned to be spaced apart from the electronic component 230 in a third direction perpendicular to the first and second directions and facing the electronic component 230.

In an embodiment of the disclosure, a plurality of slits 242 may be disposed at intervals in at least one region among the first, second, and third regions of the printed circuit board 240.

In an embodiment of the disclosure, a plurality of slits 242 may be disposed at intervals in each of the first region, the second region, and the third region of the printed circuit board 240.

In an embodiment of the disclosure, the printed circuit board 240 may include a cut region 241 formed by cutting off a portion of the printed circuit board 240 and where the electronic component 230 is disposed.

In an embodiment of the disclosure, the printed circuit board 240 may include a protrusion 243 formed between plural slits 242 and extended in a direction where a portion of the printed circuit board 240 protrudes toward the electronic component 230.

In an embodiment of the disclosure, the central slit portion 2421 is formed to extend in a direction away from the electronic component 230, and the symmetric slit portion 2422 may be extended from one end of the central slit portion 2421 in a direction perpendicular to a direction where the central slit portion 2421 is extended so as to be symmetric with respect to the central slit portion 2421.

In an embodiment of the disclosure, the printed circuit board 240 may include a protrusion 243 formed between plural slits 242 and extended in a direction where a portion of the printed circuit board 240 protrudes toward the electronic component 230, and the protrusion 243 may include a central protrusion portion 2431 in which a portion of the printed circuit board 240 protrudes and extends in a direction perpendicular to the direction where the printed circuit board 240 is extended, and a symmetric protrusion portion 2432 formed to extend from one end of the central protrusion portion 2431 in a direction perpendicular to the direction where the central protrusion portion 2431 is extended in a form symmetric with respect to the central protrusion portion 2431.

In an embodiment of the disclosure, the slit 242 may include the concave portion 2423 formed in a shape in which one side and the other side are concave toward a direction perpendicular to the direction where the slit 242 is extended, and the concave extension portion 2424 connected to the concave portion 2423 and extended from one end of the concave portion 2423 toward the printed circuit board in a direction away from the electronic component 230.

In an embodiment of the disclosure, the printed circuit board 240 may include a protrusion 247 formed between plural slits 242 and extended in a direction where a portion of the printed circuit board 240 protrudes toward the electronic component 230, and the protrusion 247 may include the central protrusion portion 2471 in which a portion of the printed circuit board 240 protrudes and extends in a direction perpendicular to the direction where the printed circuit board is extended, and the circular protrusion portion 2472 formed in a circular shape at one end of the central protrusion portion 2471.

In an embodiment of the disclosure, the slits 242 may include a first slit 242 including a central slit portion 2421 and a symmetric slit portion 2422, and a second slit 244 extended in a direction away from the electronic component 230, and the first slit 242 and the second slit 244 may be alternately disposed at intervals in at least a region of the printed circuit board 240.

In an embodiment of the disclosure, the printed circuit board 240 may include at least two protrusions 245 that are formed between plural slits 242 to protrude and extend in a direction where a portion of the printed circuit board 240 faces the electronic component 230, a protrusion 245 may include an extension portion 2451 in which a portion of the printed circuit board 240 protrudes and extends in a direction toward the electronic component 230, and a symmetric portion 2452 extended from one end of the extension portion 2451 in a direction perpendicular to the direction where the extension portion 2451 is extended, and the two protrusions 245 may be disposed with a second slit 244 interposed therebetween, and the two protrusions 245 disposed with a second slit 244 interposed therebetween may be formed to be symmetric to each other with respect to the second slit 244.

In an embodiment of the disclosure, the electronic component 230 may be a speaker or a receiver.

In an embodiment of the disclosure, the electronic device 200 may further include a battery 210 disposed to be spaced apart from the printed circuit board 240 in a length direction of the electronic device, the battery connector 270 disposed on the printed circuit board 240 and electrically connecting the printed circuit board 240 and the battery 210, and a power consuming component disposed on the printed circuit board 240 and receiving power from the battery 210, wherein the plural slits 242 may be formed in a region positioned relatively close to the power consuming component compared to other regions among the first region, the second region, and the third region.

A printed circuit board 240 according to an embodiment of the disclosure may include a cut region 241 formed by cutting off a portion of the printed circuit board 240, and plural slits 242 formed around the cut region 241, wherein each of the plural slits 242 may include a central slit portion 2421 extended along the center of the slit 242 and a symmetric slit portion 2422 extended to be symmetric with respect to the central slit portion 2421.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, or a home appliance. The electronic devices according to embodiments of the disclosure are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with an embodiment of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment of the disclosure, the module may be implemented in a form of an application-specific integrated circuit (ASIC).

An embodiment as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to an embodiment of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment of the disclosure, each component (e.g., module or program) of the above-described components may include a singular or a plurality of entities, and some of the plurality of entities may be separately disposed in any other component. According to an embodiment of the disclosure, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to an embodiment of the disclosure, operations performed by a module, program, or other component may be executed sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   an electronic component including a coil therein; and
   a printed circuit board that is disposed to surround at least a part of the electronic component and includes plural slits disposed at preset intervals in at least one of regions facing the electronic component,
   wherein each of the plural slits includes:
      a central slit portion extended along a center of the slit, and
      a symmetric slit portion extended to be symmetric with respect to the central slit portion.

2. The electronic device of claim 1,
   wherein the printed circuit board includes:
      a first region positioned to be spaced apart in a first direction of the electronic component and facing the electronic component;
      a second region positioned to be spaced apart from the electronic component in a second direction opposite to the first direction and facing the electronic component; and
      a third region positioned to be spaced apart from the electronic component in a third direction perpendicular to the first and second directions and facing the electronic component, and
   wherein the plural slits are disposed at intervals in at least one region among the first region, the second region, and the third region.

3. The electronic device of claim 2, wherein the plural slits are disposed at intervals in each of the first region, the second region, and the third region.

4. The electronic device of claim 2, further comprising:
   a battery disposed to be spaced apart from the printed circuit board in a length direction of the electronic device;
   a battery connector disposed on the printed circuit board and electrically connecting the printed circuit board and the battery; and
   a power consuming component disposed on the printed circuit board and receiving power from the battery,
   wherein the plural slits are formed in a region positioned relatively close to the power consuming component compared to other regions among the first region, the second region, and the third region.

5. The electronic device of claim 1, wherein the printed circuit board includes a cut region formed by cutting off a portion of the printed circuit board and where the electronic component is disposed.

6. The electronic device of claim 1, wherein a portion of the printed circuit board includes a protrusion that is formed between plural slits and to protrude and extend in a direction toward the electronic component.

7. The electronic device of claim 1,
   wherein the central slit portion is formed to extend in a direction away from the electronic component, and
   wherein the symmetric slit portion is extended from one end of the central slit portion in a direction perpendicular to a direction where the central slit portion is extended so as to be symmetric with respect to the central slit portion.

8. The electronic device of claim 7,
wherein a portion of the printed circuit board includes a protrusion that is formed between plural slits and to protrude and extend in a direction toward the electronic component, and
wherein the protrusion includes:
  a central protrusion portion in which a portion of the printed circuit board protrudes and extends in a direction perpendicular to a direction where the printed circuit board is extended; and
  a symmetric protrusion portion formed to extend from one end of the central protrusion portion in a direction perpendicular to a direction where the central protrusion portion is extended in a form symmetric with respect to the central protrusion portion.

9. The electronic device of claim 1, wherein the slit includes:
  a concave portion formed in a shape in which one side and another side are concave toward a direction perpendicular to a direction where the slit is extended; and
  a concave extension portion connected to the concave portion and extended from one end of the concave portion toward the printed circuit board in a direction away from the electronic component.

10. The electronic device of claim 9,
wherein a portion of the printed circuit board includes a protrusion that is formed between plural slits and to protrude and extend in a direction toward the electronic component, and
wherein the protrusion includes:
  a central protrusion portion in which a portion of the printed circuit board protrudes and extends in a direction perpendicular to a direction where the printed circuit board is extended; and
  a circular protrusion portion formed in a circular shape at one end of the central protrusion portion.

11. The electronic device of claim 1,
wherein the slits include:
  a first slit including a central slit portion and a symmetric slit portion; and
  a second slit formed to extend in a direction away from the electronic component, and
wherein the first slit and the second slit are alternately disposed at intervals in at least a region of the printed circuit board.

12. The electronic device of claim 11,
wherein a portion of the printed circuit board includes at least two protrusions that are formed between plural slits to protrude and extend in a direction toward the electronic component,
wherein the protrusion includes:
  an extension portion in which a portion of the printed circuit board protrudes and extends in a direction toward the electronic component; and
  a symmetric portion extended from one end of the extension portion in a direction perpendicular to a direction where the extension portion is extended,
wherein the at least two protrusions are disposed with a second slit interposed therebetween, and
wherein the at least two protrusions disposed with a second slit interposed therebetween are formed to be symmetrical to each other with respect to the second slit.

13. The electronic device of claim 1, wherein the electronic component is a speaker or a receiver.

14. A printed circuit board comprising:
a cut region formed by cutting off a portion of the printed circuit board; and
a plurality of slits formed around the cut region,
wherein each of the plural slits includes:
  a central slit portion extended along a center of the slit, and
  a symmetric slit portion extended to be symmetric with respect to the central slit portion.

15. The printed circuit board of claim 14, comprising:
a first region positioned in a first direction with respect to the cut region;
a second region positioned in a second direction opposite to the first direction with respect to the cut region; and
a third region positioned in a third direction perpendicular to the first and second directions with respect to the cut region,
wherein the plural slits are disposed at intervals in at least one region among the first region, the second region, and the third region.

16. The printed circuit board of claim 15, wherein the plural slits are disposed at intervals in each of the first region, the second region, and the third region.

17. The printed circuit board of claim 14,
wherein the central slit portion is formed to extend in a direction away from the cut region, and
wherein the symmetric slit portion is extended from one end of the central slit portion in a direction perpendicular to a direction where the central slit portion is extended so as to be symmetric with respect to the central slit portion.

18. The printed circuit board of claim 17,
wherein a portion of the printed circuit board includes a protrusion that is formed between plural slits and to protrude and extend in a direction toward the cut region, and
wherein the protrusion includes:
  a central protrusion portion formed by a portion of the printed circuit board that protrudes and extends in a direction perpendicular to a direction where the printed circuit board is extended; and
  a symmetric protrusion portion formed to extend from one end of the central protrusion portion in a direction perpendicular to a direction where the central protrusion portion is extended in a form symmetric with respect to the central protrusion portion.

19. The printed circuit board of claim 14, wherein the slit includes:
  a concave portion formed in a shape in which one side and another side are concave toward a direction perpendicular to a direction where the slit is extended; and
  a concave extension portion connected to the concave portion and extended from one end of the concave portion toward the printed circuit board in a direction away from the cut region.

20. The printed circuit board of claim 14,
wherein the slits include:
  a first slit including a central slit portion and a symmetric slit portion, and
  a second slit formed to extend in a direction away from the cut region, and
wherein the first slit and the second slit are alternately disposed at intervals.

* * * * *